US011798581B1

(12) United States Patent
Inturi et al.

(10) Patent No.: US 11,798,581 B1
(45) Date of Patent: Oct. 24, 2023

(54) HEAT-ASSISTED MAGNETIC RECORDING HEAD WITH NANOPARTICLES

(71) Applicant: Seagate Technology LLC, Fremont, CA (US)

(72) Inventors: Venkateswara Rao Inturi, Shakopee, MN (US); Michael C. Kautzky, Eagan, MN (US); Tong Zhao, Eden Prairie, MN (US)

(73) Assignee: SEAGATE TECHNOLOGY LLC, Fremont, CA (US)

( * ) Notice: Subject to any disclaimer, the term of this patent is extended or adjusted under 35 U.S.C. 154(b) by 0 days.

(21) Appl. No.: 17/657,698

(22) Filed: Apr. 1, 2022

Related U.S. Application Data

(60) Provisional application No. 63/170,027, filed on Apr. 2, 2021.

(51) Int. Cl.
| | |
|---|---|
| *G11B 5/00* | (2006.01) |
| *G11B 5/31* | (2006.01) |
| *G11B 13/08* | (2006.01) |
| *C23C 14/34* | (2006.01) |
| *C23C 14/08* | (2006.01) |

(52) U.S. Cl.
CPC .......... *G11B 5/3133* (2013.01); *C23C 14/086* (2013.01); *C23C 14/3414* (2013.01); *G11B 13/08* (2013.01); *G11B 2005/0021* (2013.01)

(58) Field of Classification Search
CPC ................ G11B 5/314; G11B 5/6088; G11B 2005/0021; G11B 11/10506; G11B 11/1051

USPC ............................................................ 360/59
See application file for complete search history.

(56) References Cited

U.S. PATENT DOCUMENTS

| | | | |
|---|---|---|---|
| 8,427,925 B2 | 4/2013 | Zhao et al. | |
| 8,934,198 B2 | 1/2015 | Zou et al. | |
| 9,281,002 B2 | 3/2016 | Brons et al. | |
| 9,805,757 B2 | 10/2017 | Zhao et al. | |
| 10,268,394 B2 | 4/2019 | Liu et al. | |
| 10,490,221 B1 | 11/2019 | Chen | |
| 10,510,364 B2 * | 12/2019 | Zhao ..................... | C23C 14/185 |
| 10,510,365 B2 | 12/2019 | Blaber et al. | |
| 10,964,347 B2 | 3/2021 | Cheng et al. | |
| 11,107,499 B2 | 8/2021 | Cheng et al. | |
| 2014/0376351 A1 | 12/2014 | Cheng et al. | |
| 2017/0365281 A1 | 12/2017 | Sahoo et al. | |
| 2018/0003865 A1* | 1/2018 | Guler ..................... | G02B 5/008 |
| 2018/0046382 A1 | 2/2018 | Liu et al. | |
| 2018/0102137 A1 | 4/2018 | Cheng et al. | |
| 2018/0144765 A1 | 5/2018 | Blaber et al. | |
| 2019/0153590 A1 | 5/2019 | Zhao et al. | |

(Continued)

OTHER PUBLICATIONS

Afre, et al., Transparent Conducting Oxide Films for Various Applications: A Review, Rev. Adv. Mater. Sci., Jul. 21, 2017, pp. 79-89, vol. 53, India.

(Continued)

*Primary Examiner* — Nabil Z Hindi

(57) ABSTRACT

A hard disk drive (HDD) includes a heat-assisted magnetic recording (HAMR) head. The HAMR head includes one or more features comprising a nanoparticle-reinforced plasmonic matrix. The nanoparticle-reinforced plasmonic matrix comprises a plasmonic metal and a plurality of nanoparticles dispersed in the plasmonic metal. The nanoparticles comprise a transparent conductive oxide.

15 Claims, 12 Drawing Sheets

(56) References Cited

U.S. PATENT DOCUMENTS

| | | |
|---|---|---|
| 2019/0164570 A1 | 5/2019 | Sahoo et al. |
| 2019/0164571 A1 | 5/2019 | Cheng et al. |
| 2019/0198046 A1 | 6/2019 | Natarajarathinam et al. |
| 2020/0118587 A1 | 4/2020 | Zhao et al. |
| 2020/0118591 A1 | 4/2020 | Wessel et al. |
| 2020/0227086 A1 | 7/2020 | Cheng et al. |

OTHER PUBLICATIONS

Bivour, et al., High Work Function Metal Oxides for the Hole Contact of Silicon Solar Cells, IEEE, 2016, pp. 0215-0220, Germany.

Ankit, et al., 3-D phase-field simulations of self-organization composite morphologies in physical vapor deposited phase-separating binary alloys, Journal of Applied Physics, Aug. 20, 2019, pp. 075306-075306-11, vol. 126.

London, et al., Effect of Ti and Cr on dispersion, structure and composition of oxide nano-particles in model ODS alloys, 2015, pp. 1-23, India.

Argibay, et al., Electrical resistivity of Au-ZnO nanocomposite films, Journal of Applied Physics, Apr. 11, 2013, pp. 143712-143712-6, vol. 113, Albuquerque, New Mexico.

Schoeppner, et al., Mechanical and electrical performance of thermally stable Au-ZnO films, ScienceDirect, Mar. 10, 2015, pp. 1-9, USA.

Kairaitis, et al., Mechanisms and Dynamics of Layered Structure Formation During Co-Deposition of Binary Compound Thin Films, coatings, Dec. 28, 2019, pp. 1-18, vol. 10, Lithuania.

Filoti, Microstructural evolution of sputtered phase segregated metal composite thin films, University of New Hampshire Scholars' Repository, 2010, pp. 1-187, New Hampshire, USA.

Adams, et al., Monte Carlo simulation of phase separation during thin-film codeposition, Journal of Applied Physics, Aug. 1, 1993, pp. 1707-1715, vol. 74, Ann Arbor, Michigan, USA.

Pescaglini, et al., Hot-Electron Injection in Au Nanorod-ZnO Nanowire Hybrid Device for Near-Infrared Photodetection, Nano Letters, Oct. 14, 2014, pp. 6202-6209, vol. 14, Germany.

Argibay, et al., On the thermal stability of physical vapor deposited oxide-hardened nanocrystalline gold thin films, Journal of Applied Physics, Apr. 8, 2015, pp. 145302-145302-13, vol. 117, Albuquerque, New Mexico, USA.

Atzmon, et al., Phase separation during film growth, Journal of Applied Physics, Jul. 15, 1992, pp. 442-446, vol. 72. No. 2.

Moelans, et al., Pinning effect of second-phase particles on grain growth in polycrystalline films studied by 3-D phase field simulations, ScienceDirect, Jan. 19, 2007, pp. 2173-2182, vol. 55, Leuven, Belgium.

Schoeppner, Nanoscale Strengthening Mechanisms in Metallic Thin Film Systems, Washington State University Materials Science and Engineering Program, Dec. 2014, pp. 1-189, Washington, USA.

Liu, et al., Stability of nanoslusters in an oxide dispersion strengthened alloy under neutron irradiation, Scripta Materialia, Aug. 3, 2017, pp. 1-11, Urbana, Illinois, USA.

Fu, et al., Strength and electrical conductivity behavior of nanoparticles reaction on new alumina dispersion-strengthened copper alloy, Journal of Alloys and Compounds, May 25, 2019, pp. 616-621, vol. 798, China.

Mongkolsuttirat, et al., The effects of solid solution and oxide dispersion alloying on the viscoelastic behavior of Au alloy thin films, Acta Materialia, Feb. 15, 2019, pp. 275-286, vol. 168, USA.

Bannuru, et al., The electrical and mechanical properties of Au-V and Au-V2O5 thin films for wear-resistant RF MEMS switches, Journal of Applied Physics, Apr. 21, 2008, pp. 083522-083522-6, vol. 103.

Transparent Conductive Oxide Thin Films, Materion Advanced Materials Group, pp. 1-17, Buffalo, New York, USA.

Mogonye, et al., Tribology and Sliding Electrical Contact Resistance of E-Beam Hard Au: Effects of Annealing, pp. 1-32, Albuquerque, New Mexico, USA.

Liu, et al., Radiation resistance of oxide dispersion strengthened alloys: Perspectives from in situ observations and rate theory calculations, Scripta Materialia, 2018, pp. 33-36, vol. 148, Japan.

Zhang, et al., P-type transparent conducting oxides, Journal of Physics: Condensed Matter, Jul. 27, 2016, pp. 1-20, vol. 28, UK.

\* cited by examiner

| Material | | Nanoparticle Concentration at % metallic component of nanoparticle | Optical Properties | | | Plasmonic Efficiency | |
|---|---|---|---|---|---|---|---|
| Plasmonic Metal | Nanoparticle | | refractive index (n) | extinction coefficient (k) | carrier density | electron scattering loss | plasmonic figure of merit (carrier density/electron scattering loss) |
| Au | None | n/a | 0.131 | 5.55 | -30.75 | 1.45 | 21.21 |
| | YO (non-TCO) | 0.47 | 0.136 | 5.65 | -34.17 | 1.59 | 21.44 |
| | | 0.83 | 0.144 | 5.82 | -33.83 | 1.67 | 20.22 |
| | | 1.08 | 0.164 | 5.62 | -33.89 | 1.91 | 17.74 |
| | | 1.22 | 0.161 | 5.74 | -32.90 | 1.84 | 17.85 |
| | | 1.42 | 0.201 | 5.78 | -33.36 | 2.32 | 14.38 |
| | | 1.63 | 0.233 | 5.75 | -33.00 | 2.45 | 13.48 |
| | | 1.82 | 0.249 | 5.72 | -32.63 | 2.78 | 11.74 |
| | | 2.04 | 0.250 | 5.69 | -33.32 | 2.85 | 11.34 |
| | ZnO (TCO) | 0.83 | 0.129 | 5.53 | -30.61 | 1.43 | 21.37 |
| | | 1.19 | 0.129 | 5.52 | -30.43 | 1.42 | 21.47 |
| | | 1.75 | 0.128 | 5.50 | -30.27 | 1.41 | 21.50 |
| | | 2.16 | 0.127 | 5.49 | -30.11 | 1.40 | 21.55 |
| | | 3.22 | 0.127 | 5.46 | -29.79 | 1.39 | 21.46 |

FIG. 7

HEAT-ASSISTED MAGNETIC RECORDING HEAD WITH NANOPARTICLES

This application claims priority to U.S. Provisional Patent Application Ser. No. 63/170,027, entitled "HEAT-ASSISTED MAGNETIC RECORDING HEAD WITH NANOPARTICLES" and filed Apr. 2, 2021, the entire contents of which are hereby incorporated by reference.

TECHNICAL FIELD

The disclosure relates to features of a heat-assisted magnetic recording head of a hard disk drive.

BACKGROUND

Hard disk drives (HDDs) utilize one or more magnetic recording heads fabricated on sliders to write data to and read data from magnetic disks. Data is stored in an HDD in the form of oriented magnetic grains on surfaces of magnetic disks. A magnetic recording head of an HDD may include at least one writer and at least one reader. A writer is configured to generate and direct a magnetic field toward a surface of a magnetic disk to preferably orient magnetic grains on the surface of the magnetic disk to form stored bits of data.

Magnetic recording physics imposes limits on aspects of the HDD recording system in the form of a superparamagnetic limit. Specifically, the superparamagnetic limit requires a balance of media grain size (volume) and grain magnetic anisotropy with thermal energy. Grains on a magnetic disk in which the thermal energy ($k_B T$, where $k_B$ is the Boltzmann constant and T is the temperature of the system) exceeds a threshold which is dependent on the product of the media grain size and grain magnetic anisotropy may be unstable and susceptible to data loss from grain orientation flipping. Modern recording technology development seeks to increase areal density capability (ADC) by enabling smaller bits of thermally stable data to be recorded on magnetic disks. Generally, the use of smaller bits also requires smaller grains in order to maintain signal-to-noise ratio (SNR), and smaller grains in turn require higher magnetic anisotropy to maintain data stability against thermal fluctuations. Heat-assisted magnetic recording (HAMR) is one approach to enabling smaller stable grains to be written. HAMR utilizes electromagnetic energy to heat an area of a high anisotropy magnetic disk and temporarily reduce the magnetic coercivity of grains of the magnetic disk during a write cycle, allowing these grains to more easily be preferably oriented by a field from a magnetic writer. Subsequently to writing the data, the area of the magnetic disk cools and the magnetic coercivity increases again, effectively locking in the preferably oriented state of the grains and leaving them in a thermally stable state.

In addition to including one or more writers and readers, a heat-assisted magnetic recording head (hereafter HAMR head) may further include a light source (e.g., a laser), a light delivery system (e.g., a waveguide), and a near-field transducer (NFT). An NFT is configured to receive electromagnetic energy (i.e., photons) from the light source by way of the light delivery system, excite localized surface plasmons (LSP) on a surface of the NFT, and focus the near-field energy of the LSP distribution on a spot on a surface of a magnetic disk. Localized surface plasmons (LSPs) are generated on the NFT by coupling of the electromagnetic energy from the light delivery system with free electrons of the NFT. The LSP distribution may then condense and localize on an area or feature of the NFT, allowing the near-field of the LSP distribution to be focused on the surface of the magnetic disk. The conversion of incident propagating electromagnetic energy to an evanescent near-field distribution associated with LSPs allows the focused spot on the magnetic disk surface to be much smaller than the limit imposed by the diffraction limit of the associated light source wavelength (e.g., a spot size on the order of 50 nm or less can be achieved with incident electromagnetic waves with a wavelength on the order of 830 nm). In some examples, the focused spot of LSP near-field energy on the surface of the magnetic disk heats the surface and temporarily reduces the coercivity of the magnetic grains of the magnetic disk, allowing a writer to preferably orient more grains of the magnetic disk than a magnetic recording head that does not include an NFT, a light source, and a light delivery system. High temperatures may be generated within regions and features of the HAMR head (e.g., in an NFT) during the HAMR write operation as a result of scattering and other non-plasmonic loss of incident electromagnetic energy from the light source, as well as from thermal energy from the highly localized concentration of LSPs on the NFT.

Certain metals which may be referred to as "plasmonic metals" (e.g., gold, silver) are most suitable for generating LSPs from incident electromagnetic energy due to their material properties such as optical response coefficients (e.g., refractive index and extinction coefficient), electrical permittivity, and free electron density, and these materials are commonly used as for fabricating features of a HAMR head (e.g., NFTs, NFT features such as disks and pegs; miniature solid immersion mirrors; and heat sink structures). However, ideal plasmonic metals may also be susceptible to various defect modes related to thermal instability in the presence of high temperatures generated during the HAMR write operation (e.g., feature recession, deformation, voiding, oxidation, and delamination). Example HAMR heads and their features may suffer from thermal and mechanical degradation from repeated exposure to these elevated temperatures, leading to performance, reliability, and lifetime concerns of the HAMR HDD.

SUMMARY

The present disclosure describes features of a heat-assisted magnetic recording (HAMR) head of a hard disk drive (HDD), the features comprising a nanoparticle-reinforced plasmonic matrix, where the nanoparticle-reinforced matrix comprises a transparent conductive oxide (TCO) nanoparticles dispersed in a plasmonic metal. In some examples, one or more features of the HAMR head (e.g., a disk of a near-field transducer (NFT), a peg of an NFT, a heat sink disk of an NFT, a miniature solid immersion mirror (mSIM), a heat sink structure) comprise a nanoparticle-reinforced plasmonic matrix, where the nanoparticle-reinforced plasmonic matrix comprises a plasmonic metal (e.g., gold, silver) and TCO nanoparticles (e.g., zinc oxide, tin oxide, indium tin oxide, doped zinc oxide). In some scenarios, the inclusion of a nanoparticle-reinforced plasmonic matrix in a feature of a HAMR head provides the feature with improved thermal stability and defect resistance over a similar feature which does not include a nanoparticle-reinforced plasmonic matrix. In contrast to example HAMR heads including features which include a plasmonic material and do not include TCO nanoparticles, a HAMR head that includes features which include a nanoparticle-reinforced plasmonic matrix may demonstrate higher thermal stability, resistance to defect modes (e.g., feature recession, voiding, deformation, delamination), better reliability performance, and a longer lifetime.

In one example, a device comprises a heat-assisted magnetic recording head, the heat-assisted magnetic recording head comprising one or more features comprising a nanoparticle-reinforced plasmonic matrix, wherein the nanoparticle-reinforced plasmonic matrix comprises: (i) a plasmonic metal; and (ii) a plurality of nanoparticles dispersed in the plasmonic metal, and wherein the nanoparticles comprise a transparent conductive oxide.

In another example, a heat-assisted magnetic recording head comprising at least one of: (i) a peg; (ii) a disk; (iii) a miniature solid immersion mirror; and (iv) a heat sink structure, wherein the at least one of the peg, disk, miniature solid immersion mirror, or heat sink structure comprises a nanoparticle-reinforced plasmonic matrix, wherein the nanoparticle-reinforced plasmonic matrix comprises: (i) a plasmonic material; and (ii) a plurality of nanoparticles dispersed in the plasmonic material, and wherein the nanoparticles comprise a transparent conductive oxide.

These and other features and aspects of various examples may be understood in view of the following detailed discussion and accompanying drawings.

BRIEF DESCRIPTION OF THE DRAWINGS

FIG. 7 is a table of optical and plasmonic properties of co-sputtered plasmonic metal/secondary metal composites and pure gold (i.e., no nanoparticles)

DETAILED DESCRIPTION

Figure 1:
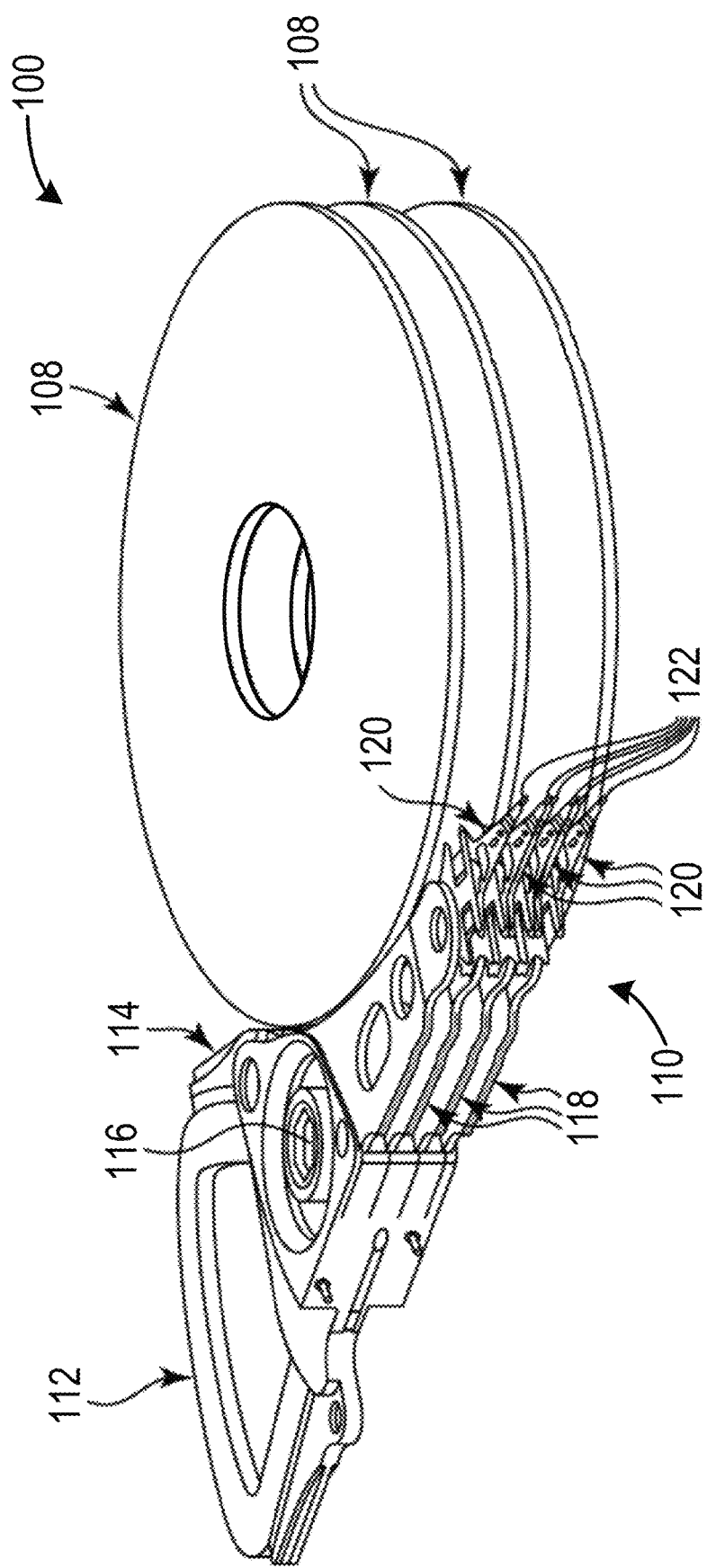
FIG. 1 is a perspective view of an example heat-assisted magnetic recording (HAMR) hard disk drive, in accordance with aspects of this disclosure.

FIG. 1 is a perspective view of an example heat-assisted magnetic recording (HAMR) hard disk drive (HDD), in accordance with aspects of this disclosure. HDD 100 includes a head stack assembly (HSA) 110 and one or more magnetic disks 108. HSA 110 includes a plurality of head gimbal assemblies (HGA) 120. Each HGA 120 includes a slider 122. Each slider 122 includes a heat-assisted magnetic recording (HAMR) head (not shown in FIG. 1).

HSA 110 of FIG. 1 includes a voice coil drive actuator 112. Voice coil drive actuator 112 produces a magnetic field which exerts a force on an actuator mechanism 114, causing actuator mechanism 114 to rotate about a shaft 116 in either rotational direction. Rotatable drive actuator arms 118 are mechanically coupled to actuator mechanism 114 and to each HGA of HGAs 120 such that rotating actuator mechanism 114 causes rotatable drive actuator arms 118 and HGAs 120, and thus sliders 122, to move relative to magnetic disks 108.

Each HAMR head of sliders 122 includes a plurality of active components that are configured to perform or assist in performing drive operations (e.g., read operations, write operations, heating operations). Examples of active components include a writer, a reader, a heater (e.g., a read heater or a write heater), and a near-field transducer (NFT). A drive controller or other suitable control circuitry of HDD 100 (not shown) outputs control signals to direct the respective active components of HAMR heads of sliders 122. In some examples, the active components are configured to activate in response to receiving one or more control signals. In one example, a control signal includes data to be written to one of magnetic disks 108 by a writer of a HAMR head associated with one of sliders 122. In another example, a control signal applies a bias to a reader of a HAMR head associated with one of sliders 122. In another example, a control signal activates a heater of a HAMR head associated with one of sliders 122 prior to and/or during a drive operation. In another example, a control signal directs electromagnetic energy to be sent from a light source of a slider 122 to an NFT of a HAMR head of the slider 122.

Figure 2:
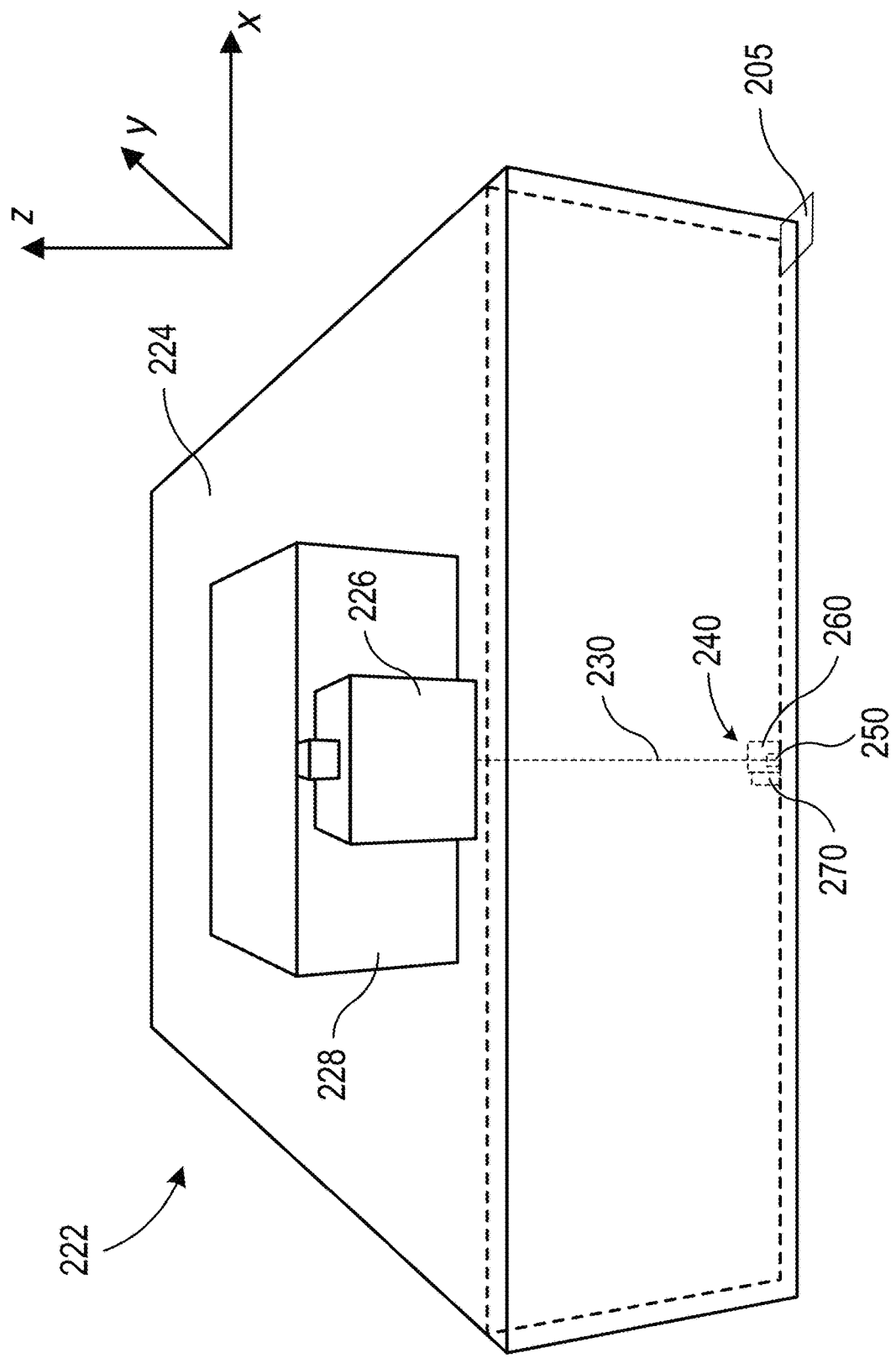
FIG. 2 is a perspective view of an example HAMR slider, in accordance with aspects of this disclosure.

FIG. 2 is a perspective view of an example HAMR slider 222 (e.g., a slider 122 of HDD 100 of FIG. 1), in accordance with aspects of this disclosure. Slider 222 includes a slider body 224, a laser 226, a submount 228, a waveguide 230, and a heat-assisted magnetic recording (HAMR) head 240. HAMR head 240 includes a near-field transducer (NFT) 250, writer(s) 260, and reader(s) 270. In the example of FIG. 2, some features, or parts of features of NFT 250, writer(s) 260, and reader(s) 270 (e.g., features such as a peg of NFT 250, a write pole of writer 260, a free layer and a pinned layer of reader 270), are presented on a media-facing air-bearing surface (ABS) 205 that is positioned over a surface of a magnetic disk (not shown) during some operations of the HDD. During such operations, ABS 205 faces and is held proximate to the moving magnetic disk surface by a cushion of gas, known as an active air bearing (AAB), that is produced from a dynamic flow of gas across a pattern of recessed sub-surfaces bound within the volume of slider body 224 by ABS 205.

Laser 226 is configured to emit photons of an approximate target wavelength. In some examples, laser 226 emits photons with an approximate wavelength in the near infrared range or visible range. In one example, laser 226 emits photons with an approximate target wavelength of 830 nm, qualifying laser 226 as a near infrared (NIR) source. Examples of laser 226 include an optically pumped semiconductor laser, a quantum well laser, and an integrated laser. Laser 226 of this example may be configured as an edge emitting laser (EEL), vertical cavity surface emitting laser (VCSEL), or other type of laser diode. Other example HAMR heads may include other types of light sources such as light emitting diodes (LEDs) and surface emitting diodes.

Laser 226 is coupled to slider body 224 via submount 228. In the example of FIG. 2, laser 226 and submount 228 are located on a face of slider body 224 which is opposite to ABS 205. In other example HAMR sliders, a laser may be directly mounted to the slider body. Submount 228 may be configured to redirect photon output from laser 226 so that it is directed into waveguide 230 in the negative z-direction of FIG. 2. The path between laser 226 and waveguide 230 may include one or more optical couplers, mode converters, and/or mode couplers. Waveguide 230 is formed integrally within slider body 224 and is configured to deliver photons from laser 226 to NFT 250.

NFT 250 is configured to generate and support a distribution of localized surface plasmons (LSPs) upon receiving incident photons from laser 226 by way of waveguide 230, condense the LSP distribution on an area or feature of NFT 250, and focus near-field energy of the LSP distribution on a spot on a surface of a magnetic disk (e.g., a magnetic disk 108 of FIG. 1). Writer 260 is configured to generate a magnetic field from an electrical current and aim the magnetic field at an area of the magnetic disk which includes the spot of focused near-field energy of the LSP distribution of NFT 250. The near-field energy of the LSP distribution heats and lowers the coercivity of the magnetic grains in the spot of focus, thereby enabling these magnetic grains to be preferentially oriented by the magnetic field of writer 260. Turning off laser 226 or moving NFT 250 toward a different location of the magnetic disk (or moving the magnetic disk such that NFT 250 faces a different location of the magnetic disk) removes the focused near-field energy from the spot on the magnetic disk, allowing the magnetic grains to cool and thereby locking in the preferred grain orientation, and thus bits of written data, induced by the magnetic field from writer 260. These steps of applying focused near-field energy to a surface of a magnetic disk, applying a magnetic field which is at least partially coincident with the near-field energy on the surface of the magnetic disk, ceasing the near-field energy and applied magnetic field, and cooling the surface of the magnetic disk describe, at a high level, the HAMR write operation.

The HAMR write operation, and more specifically the process of generating and sustaining LSPs on an NFT, may be accompanied by a temperature increase in a HAMR head and its associated features. A temperature increase in a HAMR head and/or one or more of its features may result from incident photons from a laser or other source which are not converted into LSPs and are lost through thermal excitation, scattering, and/or other non-resonant modes. Incident photon energy losses may reduce the efficiency of LSP generation and increase the laser power which is required to maintain the LSP distribution needed to heat the magnetic disk surface and lower the magnetic coercivity of the associated grains. Such an increase in laser power may increase the temperature of a HAMR head and/or one or more of its respective features. In some scenarios, a concentrated near-field distribution of LSPs on an NFT which is generated during a write operation of a HAMR head may increase the temperature of a HAMR head and/or one or more of its respective features. In some instances, heat is generated by non-radiative decay of LSPs. For example, an LSP may decay and generate hot electrons (i.e., free electrons which acquire high kinetic energy). Hot electrons, in some instances, scatter and decay non-radiatively, generating heat in a HAMR head. In some scenarios, a hot electron is scattered by another electron and generates additional modes which are accompanied by non-radiative decay. In other instances, a hot electron may scatter another electron and/or LSP. In some example NFTs, electron scattering may reduce the efficiency of LSP generation and increase the operating temperature of a HAMR head and/or one or more of its respective features.

Example HAMR head features (e.g., NFTs, NFT features such as pegs and disks, heat sink structures, miniature solid immersion mirrors) often comprise plasmonic metals. As used herein, a plasmonic metal is a metal which possess properties (e.g., electrical properties, optical properties) which promote resonance coupling between photons incident upon the plasmonic metal and free electrons of the plasmonic metal. Such resonant coupling of a photon with free electrons of the plasmonic metal may excite one or more plasmonic modes of the plasmonic metal, which may result in the generation of an LSP on a surface of the plasmonic metal. Examples of plasmonic metals include gold, silver, ruthenium, copper, aluminum, rhodium, and combinations thereof.

The efficiency of LSP generation and maintenance in a plasmonic metal may be characterized by a plasmonic figure of merit, with preferred plasmonic metals for a particular application demonstrating high plasmonic figures of merit in response to photons within a wavelength range defined by the application. In the case of a HAMR head, such as HAMR head 240 of FIG. 2, a plasmonic feature (i.e., a feature comprising a plasmonic metal, such as NFT 250) may be coupled to an optical feature, such as waveguide 230, which is configured to direct photons toward a surface of the plasmonic feature in order to promote LSP generation on the plasmonic feature. The plasmonic metal in NFT 250 may be selected based on having a high figure of merit in response to photons in a wavelength range of a light source of the slider, such as laser 226 of slider 222 of FIG. 2.

Common plasmonic metals which demonstrate high plasmonic figures of merit (e.g., gold) may be prone to thermal defects, instability, and degradation at temperatures which are encountered by the HAMR head under normal operating conditions. Such repeated and prolonged thermal exposure may lead to thermal degradation, physical defects, deformation and/or recession of features which may reduce the performance and/or shorten the lifetimes of a HAMR head. In some examples, features of HAMR head may develop defects associated with changes in grain structure, grain boundaries, and/or microstructure of a constituent plasmonic metal. Example defects include grain boundary migration, interface degradation, delamination, voiding, feature separation, and other thermally induced defect modes. In some instances, such defects lead to increased operating temperatures of a HAMR head and/or one or more of its respective features, which may further increase and accelerate thermal defect creation and propagation. In other scenarios, the increased presence of defects in the plasmonic metal of a HAMR head feature such as an NFT may impact the plasmonic figure of merit and lead to increased laser power to maintain the LSP density required for HDD operation. Such increase in laser power may increase the operating temperature of the HAMR head and thus accelerate defect formation and migration.

In view of these aspects, it is desirable to construct a feature of a HAMR head with a material or combination of materials which can promote the generation of an LSP distribution through resonant plasmonic mode coupling with incident photons from a source, can sustain the distribution of LSPs, and can endure repeated and extended thermal exposure without experiencing thermal degradation which compromises the performance and lifetime of the HAMR head. In some examples, a feature of a HAMR head comprises a plasmonic metal/secondary material composite, wherein a secondary material (e.g., nanoparticles, metal atoms) may be mixed with, dispersed in, or otherwise added to a plasmonic metal to increase thermal stability and/or mitigate thermal degradation, defect formation, and/or defect propagation in the feature relative to a similar feature which includes the plasmonic metal and does not include the secondary material.

In accordance with techniques of this disclosure, example HDDs comprise a HAMR head (e.g., HAMR head 240 of FIG. 2), the HAMR head comprising one or more features comprising a nanoparticle-reinforced plasmonic matrix, wherein the nanoparticle-reinforced plasmonic matrix comprises: (i) a plasmonic metal, and (ii) a plurality of nanoparticles dispersed in the plasmonic metal, and wherein the nanoparticles comprise a transparent conductive oxide (TCO). In some examples, an HDD comprises a HAMR head, the HAMR head comprising one or more features comprising a nanoparticle-reinforced plasmonic matrix, wherein the nanoparticle-reinforced plasmonic matrix comprises: (i) a plasmonic metal, and (ii) a plurality of nanoparticles dispersed in the plasmonic metal, wherein the nanoparticles comprise a transparent conductive oxide (TCO), and wherein the plasmonic metal comprises gold; silver; ruthenium; copper; aluminum; rhodium; or combinations thereof. In one example, an HDD comprises a HAMR head, the HAMR head comprising one or more features comprising a nanoparticle-reinforced plasmonic matrix, wherein the nanoparticle-reinforced plasmonic matrix comprises: (i) a plasmonic metal, and (ii) a plurality of nanoparticles dispersed in the plasmonic metal, wherein the nanoparticles comprise a transparent conductive oxide (TCO), and wherein the plasmonic metal comprises gold.

As used herein, the term "nanoparticle-reinforced plasmonic matrix" refers to a plasmonic metal/secondary material composite comprising: (i) a plasmonic metal, and (ii) a plurality of TCO nanoparticles that are dispersed in the plasmonic metal. The inclusion of a nanoparticle-reinforced plasmonic matrix in a feature of a HAMR head may, in some examples, provide a similar plasmonic figure of merit to, and better thermal stability (e.g., grain stability, resistance to defect migration, resistance to deformation) than, a similar feature which does not include a nanoparticle-reinforced plasmonic matrix. In other words, a feature of a HAMR head which includes a nanoparticle-reinforced plasmonic matrix may demonstrate advantages over a similar feature that includes the same plasmonic material and does not include dispersed TCO nanoparticles. Providing such thermal benefits to a HAMR head without compromising the plasmonic figure of merit of the constituent plasmonic metal may provide the HAMR head comprising the nanoparticle-reinforced plasmonic matrix with improved performance, reliability, and/or lifetime over a similar HAMR head which does not comprise a nanoparticle-reinforced plasmonic matrix.

Nanoparticles are a class of materials which may be defined as discrete bodies of a material or materials with sizes on the order of about 100 nm or less. The small dimensions of nanoparticles may enable the observation of unique properties related to their constituent material(s) which are not observed in the bulk state. For example, size quantization effects may produce unique electronic and/or optical properties related to narrowed electronic bands and discrete levels of excitation. Additionally, their small size may enable them to provide physical and structural benefits to certain applications, such as nanoparticle-strengthened composites. Such unique properties may enable nanoparticles to provide benefits when used in certain applications, and indeed many variations of nanoparticles have been and are used in an extensive range of applications.

Nanoparticles may be generally regularly shaped (e.g., nanoparticles that are generally spherical, nanoparticles that are generally ellipsoidal), or irregularly shaped. The size distribution of nanoparticles may vary and depend on their use, application, formation process, constituent material, and other factors. Generally, a sample of nanoparticles will include a range of sizes (e.g., a distribution of generally spherical nanoparticles ranging in size from about 1 nm to about 5 nm).

Nanoparticles may comprise elemental materials (e.g., metals, non-metals) and molecular compounds. Nanoparticles may comprise ceramic materials (e.g., oxides, nitrides, carbides), polymeric materials, metal alloys, composite materials, or other categories and subcategories of materials such as TCOs. Nanoparticles may be crystalline (i.e., a nanoparticle may be a single crystal, also called a nanocrystal), polycrystalline, semicrystalline, amorphous, or of another mixed state or phase. In some examples, nanoparticles may be dispersed in another material to form a matrix. Nanoparticles in a matrix may be dispersed uniformly, semi-uniformly, or non-uniformly in a matrix.

Transparent conductive oxides (TCOs) are a class of oxide materials which, in some examples, have material properties of optical transparency in the visible electromagnetic spectrum, high reflectivity in the near infrared electromagnetic spectrum, and electrical properties (e.g., conductivity) which are similar to those of many conductive metals and semiconductors. Representative examples of TCOs include zinc oxide, indium oxide, tin oxide, cadmium oxide, nickel oxide, indium tin oxide, and indium zinc oxide. Transparent conductive oxide nanoparticles may also include combinations of TCOs. Representative combinations may include a combination of distinct TCO nanoparticles (e.g., zinc oxide nanoparticles and indium oxide nanoparticles) or a combination of TCOs within a single nanoparticle (e.g., zinc tin oxide nanoparticles, zinc cadmium indium oxide nanoparticles). A TCO may further include a dopant. A dopant may be included in a TCO to enhance or modify electrical and/or optical properties of the TCO (e.g., carrier density, band gap energy, refractive index, extinction coefficient). A dopant may include aluminum, tin, fluorine, antimony, indium, molybdenum, tantalum, zirconium, boron, gallium, magnesium, lithium, or combinations thereof (e.g., aluminum doped zinc oxide, indium doped tin oxide). In accordance with techniques of this disclosure, an example HDD comprises a HAMR head (e.g., HAMR head 240 of FIG. 2), the HAMR head comprising one or more features comprising a nanoparticle-reinforced plasmonic matrix, wherein the nanoparticle-reinforced plasmonic matrix comprises: (i) a plasmonic metal, and (ii) a plurality of nanoparticles dispersed in the plasmonic metal, wherein the nanoparticles comprise a transparent conductive oxide (TCO), and wherein the TCO comprises zinc oxide; indium oxide; tin oxide; cadmium oxide; nickel oxide; indium tin oxide; indium zinc oxide; or combinations thereof. In one example, a TCO of a TCO nanoparticle in a nanoparticle-reinforced plasmonic matrix comprises zinc oxide. In some examples, a TCO of a TCO nanoparticle in a nanoparticle-reinforced plasmonic matrix further comprises a dopant, wherein the dopant comprises aluminum; tin; fluorine; antimony; indium; molybdenum; tantalum; zirconium; boron; gallium; magnesium; lithium; or combinations thereof.

A concentration of TCO nanoparticles in a nanoparticle-reinforced plasmonic matrix may be defined in terms of a percentage of the matrix. For example, a feature of HAMR head 240 of FIG. 2 may comprise a nanoparticle-reinforced plasmonic matrix, wherein the concentration of the TCO nanoparticles in the matrix is defined by an atomic percentage of the matrix that is occupied by the metallic component of the TCO nanoparticles. In other examples, a nanoparticle-reinforced plasmonic matrix may include a concentration of TCO nanoparticles which is defined by a weight percentage of the nanoparticle-reinforced plasmonic matrix that is occupied by the TCO nanoparticles.

A concentration of TCO nanoparticles in a nanoparticle-reinforced plasmonic matrix may be characterized by various laboratory techniques. In one example, inductively coupled plasma optical emission spectroscopy (ICP-OES) is used to determine a concentration of the TCO nanoparticles in the nanoparticle-reinforced plasmonic matrix. In the example of ICP-OES, a deposited film of the nanoparticle-reinforced plasmonic matrix is dissolved in an acidic solution and, in some instances, is diluted. The solution is placed in a spectrometer and atomized in an argon plasma. The atoms of the solution emit light at wavelengths which are characteristic of the constituent elements. The relative intensity of emission of a characteristic wavelength is proportional to the concentration of its associated element, and a comparison of the spectrum emitted from the sample to an emission of a known standard may, in some instances, allow the relative concentrations of the constituent elements to be determined in atomic percentage (i.e., at. %).

In the example of TCO nanoparticles dispersed in a plasmonic metal in a nanoparticle-reinforced plasmonic matrix, a measurement of a concentration of the TCO nanoparticles using ICP-OES may provide the atomic percentage the nanoparticle-reinforced plasmonic alloy that is occupied by the metallic component of the TCO nanoparticle (e.g., zinc for zinc oxide nanoparticle, indium and tin for indium tin oxide nanoparticles), thus providing a means of quantifying the concentration of TCO nanoparticles in the nanoparticle-reinforced plasmonic matrix in at. %. The atomic percentage of the metallic component of the TCO nanoparticles may be used along with structural properties of the TCO (e.g., density, stoichiometry) to determine volumetric percent (vol. %) or weight percent (wt. %) of the TCO nanoparticles in the nanoparticle-reinforced plasmonic matrix. Hereafter, a concentration of TCO nanoparticles dispersed in a plasmonic metal in a nanoparticle-reinforced plasmonic matrix will be reported as the atomic percentage (at. %) of the nanoparticle-reinforced plasmonic matrix that is occupied by the metallic component of the TCO nanoparticles. In some examples, HAMR heads of this disclosure may include features comprising a nanoparticle-reinforced plasmonic matrix, wherein the concentration of the TCO nanoparticles in the nanoparticle-reinforced plasmonic matrix is up to about 15 at. %, as measured using ICP-OES.

The thermal stability gain which the inclusion of a nanoparticle-reinforced plasmonic matrix may provide to a feature of a HAMR head (e.g., HAMR head 240 of FIG. 2) may result from physical effects of the dispersed TCO nanoparticles on grains and defects in the plasmonic metal, such as pinning of defects and/or grain boundaries of the plasmonic metal, stabilization of the grain boundaries of the plasmonic metal, and pinning and/or slowing the migration of defects. For example, a moving grain boundary may be impeded or slowed by one or more TCO nanoparticles. Specifically, a grain boundary may drag across one or more TCO nanoparticles, effectively slowing the movement of the grain boundary during thermal exposure. Such slowing of grain boundary movement may, in some scenarios, provide an improvement in grain stability under thermal exposure, thus prolonging lifetime and/or defect resistance of a feature which includes the plasmonic material and the dispersed nanoparticles.

The thermal benefits provided by the dispersed TCO nanoparticles in a nanoparticle-reinforced plasmonic matrix may scale with increasing concentration of the TCO nanoparticles. For example, a first nanoparticle-reinforced plasmonic matrix comprising a first concentration of TCO nanoparticles in a plasmonic metal may demonstrate higher thermal stability than a second nanoparticle-reinforced plasmonic matrix comprising a second, lower concentration of TCO nanoparticles in the plasmonic metal. It is thus desirable, from a mechanical perspective, to include a high concentration of TCO nanoparticles in a nanoparticle-reinforced plasmonic matrix. However, the optical properties of the plasmonic metal must also be considered, as the plasmonic figure of merit of a plasmonic metal is dependent on its optical response (e.g., refractive index n and extinction coefficient k) to incident photons from a light source. While a concentration of an example secondary material in an example plasmonic metal may provide higher thermal stability than the plasmonic metal on its own, the presence of sufficiently high concentrations of a secondary material in a plasmonic metal may change the optical properties of the plasmonic metal/secondary material composite and reduce the plasmonic figure of merit. At sufficiently high concentrations of some secondary materials, additional heat generated by scattering of photons and/or electrons by the secondary material, and/or loss in plasmonic figure of merit due changes to the optical properties, may result in an operating temperature increase which exceeds the thermal stability gains achieved by introduction of the nanoparticles. In other words, in some examples, a thermal stability gain achieved by the inclusion of a secondary material in a plasmonic metal may need to balance the magnitude of thermal stability gain with the change in optical properties which results from the inclusion of the secondary material. In such examples, there is a trade-off between thermal stability gain and optical response degradation. A direction of goodness for the selection of a secondary material is one which can be dispersed in a plasmonic metal at sufficiently high concentrations to provide thermal stability gains with low impact to the optical response of the resultant plasmonic material/secondary material composite. Such qualification of a secondary material can be considered "concentration latitude", and a candidate secondary material which provides a high concentration latitude (i.e., high thermal stability improvement with low optical response impact) is desirable.

The use of TCO nanoparticles as a secondary material, as in the example of a nanoparticle-reinforced plasmonic matrix, may offer an unexpected benefit of providing higher concentration latitude than other secondary materials. That is, a nanoparticle reinforced plasmonic matrix which includes a concentration of TCO nanoparticles dispersed in a plasmonic metal may exhibit n and k values which are closer to those of the pure plasmonic material than another plasmonic metal/secondary material composite which includes the same concentration of a non-TCO nanoparticle secondary material in the plasmonic metal. In some examples, the low impact of some concentrations of TCO nanoparticles to the n and k values of a nanoparticle-reinforced plasmonic matrix allows the TCO nanoparticles to be included at higher concentrations while maintaining acceptable n and k (i.e., n and k required to maintain a target plasmonic figure of merit) than would be achievable with the inclusion of non-TCO nanoparticle secondary materials in other plasmonic metal/secondary material composites. The example nanoparticle-reinforced plasmonic matrices of this disclosure may demonstrate higher thermal stability and plasmonic figures of merit than other plasmonic metal/secondary material composites, enabled by the ability to disperse TCO nanoparticles in a plasmonic metal at high concentrations without significantly impacting the plasmonic figure of merit. In contrast to example HAMR head features which do not include a nanoparticle-reinforced plasmonic matrix, the example HAMR head features of this disclosure which include a nanoparticle-reinforced plasmonic matrix may offer higher thermal stability, and better reliability of an associated HAMR head.

In some scenarios, a nanoparticle-reinforced plasmonic matrix may further comprise a secondary atom. Secondary atoms may include nickel (Ni), boron (B), bismuth (Bi), indium (In), sulfur (S), silicon (Si), tin (Sn), manganese (Mn), tellurium (Te), holmium (Ho), lutetium (Lu), praseodymium (Pr), scandium (Sc), uranium (U), barium (Ba), chlorine (Cl), cesium (Cs), dysprosium (Dy), europium (Eu), fluorine (F), germanium (Ge), hydrogen (H), iodine (I), rubidium (Rb), selenium (Se), terbium (Tb), nitrogen (N), oxygen (O), carbon (C), antimony (Sb), gadolinium (Gd), samarium (Sm), thallium (Tl), cadmium (Cd), neodymium (Nd), phosphorus (P), lead (Pb), hafnium (Hf), niobium (Nb), erbium (Er), zinc (Zn), magnesium (Mg), palladium (Pd), vanadium (V), zinc (Zn), chromium (Cr), iron (Fe), lithium (Li), platinum (Pt), sodium (Na), strontium (Sr), calcium (Ca), yttrium (Y), thorium (Th), beryllium (Be), thulium (Tm), erbium (Er), ytterbium (Yb), promethium (Pm), neodymium (Nd), cobalt (Co), cerium (Ce), lanthanum (La), praseodymium (Pr), or combinations thereof.

The inclusion of a secondary atom in a nanoparticle-reinforced plasmonic matrix may, in some instances, provide additional thermal benefits, supplementing the thermal benefits provided by the TCO nanoparticles. For example, the secondary atoms may stabilize grain boundaries and the TCO nanoparticles may slow grain boundary migration through a pinning effect, with a small impact of the TCO nanoparticles on the optical properties, and thus the plasmonic figure of merit, of the nanoparticle-reinforced plasmonic matrix.

The concentration of a secondary atom in a nanoparticle-reinforced plasmonic matrix may be measured using inductively coupled plasma optical emission spectroscopy (ICP-OES). A measurement of a concentration of a secondary atom in a nanoparticle-reinforced plasmonic matrix using ICP-OES may provide the atomic percentage of the nanoparticle-reinforced plasmonic matrix that is occupied by the secondary atom, thus providing a means of quantifying the concentration of TCO nanoparticles in the nanoparticle-reinforced plasmonic matrix in at. %. The atomic percentage of the secondary material may be used along with its structural properties (e.g., density, atomic weight) to determine volumetric percent (vol. %) or weight percent (wt. %) of the secondary atom in the nanoparticle-reinforced plasmonic matrix. Hereafter, a concentration of a secondary atom in a nanoparticle-reinforced plasmonic matrix will be reported as the atomic percentage (at. %) of the nanoparticle-reinforced plasmonic matrix that is occupied by the secondary atom.

In accordance with aspects of this disclosure, an example feature of a HAMR head of an HDD includes one or more features comprising a nanoparticle-reinforced plasmonic matrix, wherein the nanoparticle-reinforced plasmonic matrix comprises: (i) a plasmonic metal; (ii) TCO nanoparticles; and (iii) at least one secondary atom. In one example, a feature of a HAMR head comprises a nanoparticle-reinforced plasmonic matrix comprising at least one secondary atom, wherein the concentration of the at least one secondary atom in the nanoparticle-reinforced plasmonic matrix is up to about 20 at. %. In one example, TCO nanoparticles may be included in a feature at a first concentration and a secondary atom may be included in the feature at a second concentration. The first concentration may be different than the second concentration.

A nanoparticle-reinforced plasmonic matrix may be deposited with one of several processes, including RF sputtering, DC sputtering, thermal evaporation, plating, and electron beam evaporation. In some examples, a feature of a HAMR head (e.g., an NFT, a heat sink structure, or respective features of these) which includes a nanoparticle-reinforced plasmonic matrix is deposited by codeposition of the plasmonic metal and the TCO nanoparticle material from different sources. For example, a sputtering process may include sputtering a plasmonic metal from a first target at a first power and a first deposition rate, and sputtering a TCO from a second target at a second power and a second, lower deposition rate. In one example, the second target comprises the TCO. In another example, the second target comprises the metallic component of the resultant TCO.

In some examples, a plasmonic metal may be evaporated from a first source at a first temperature and a first deposition rate, and the metallic component of a resultant TCO may be evaporated from a second source at a second temperature and a second deposition rate.

In some examples, a sputtering process may include sputtering a plasmonic metal from a first target comprising the plasmonic metal at a first power and a first deposition rate, sputtering a TCO from a second target comprising the TCO or the metallic component of the TCO at a second power and a second deposition rate, and sputtering a secondary atom from a third target comprising the secondary atom at a third power and a third deposition rate. In some examples, a sputtering process may include sputtering a plasmonic metal and a secondary atom from a first target comprising the plasmonic metal and the secondary atom at a first power and a first deposition rate, and sputtering a TCO from a second target comprising the TCO or the metallic component of the TCO at a second power and a second deposition rate.

In some examples, a sputtering process may include sputtering a plasmonic metal from a first target comprising the plasmonic metal at a first power and a first deposition rate, sputtering a first TCO from a second target comprising the metallic component of the resultant first TCO at a second power and a second deposition rate, and sputtering a second TCO from a third target comprising the metallic component of the resultant second TCO at a target power and deposition rate (e.g., the second power and second deposition rate, a third power and third deposition rate). In some examples, a sputtering process may include sputtering a plasmonic metal from a first target comprising the plasmonic metal at a first power and a first deposition rate, sputtering a first TCO from a second target comprising the first TCO at a second power and a second deposition rate, and sputtering a second TCO from a third target comprising the second TCO or the metallic component of the resultant second TCO at a target power and deposition rate (e.g., the second power and second deposition rate, a third power and third deposition rate).

A sputtering process may include sputtering a plasmonic metal from a first target comprising the plasmonic metal at a first power and a first deposition rate, sputtering a TCO from a second target comprising the TCO or the metallic component of the resultant TCO at a target power and deposition rate, and sputtering a dopant of the resultant TCO from a third target at a target power and deposition rate.

A sputtering process may include sputtering a plasmonic metal from a first target comprising the plasmonic metal at a first power and a first deposition rate, sputtering a TCO from a second target comprising the TCO or the metallic component of the resultant TCO at a target power and deposition rate, and sputtering a secondary atom from a third target at a target power and deposition rate.

In one scenario, a sputtering process includes sputtering a first plasmonic metal from a first target comprising the first plasmonic metal at a first power and a first deposition rate, sputtering a second plasmonic metal from a second target comprising the second plasmonic metal at a target power and deposition rate (e.g., the first power and first deposition rate, a second power and second deposition rate), and sputtering a TCO from a third target comprising the TCO or the metallic component of the TCO at a target power and deposition rate (e.g., a lower power and lower deposition rate than the power(s) and deposition rate(s) of the first and second plasmonic metals).

In some examples, a sputtering process may include sputtering a plasmonic metal and a TCO from a single target. A sputtering target may, for example, comprise a plasmonic metal at a first percentage of the composition of the target and a metallic component of the resultant TCO at a second, different percentage of the composition of the target. A sputtering target, in other examples, may comprise a plasmonic metal at a first percentage of the composition of the target and a TCO at a second, different percentage of the composition of the target.

In some examples, a sputtering target may include multiple metallic components for one or more TCOs. In one example, a sputtering target may include a first metallic component for a first TCO and a second metallic component for a second TCO. In another example, a sputtering target includes a first metallic component for a first combination TCO and a second metallic component for the first combination TCO. In some examples, a sputtering target includes a first TCO and a second TCO. In one example, a first TCO sputtered from a first target forms a first TCO nanoparticle and a second TCO sputtered from the first target forms a second TCO nanoparticle. In one example, a first TCO sputtered from a first target and a second TCO sputtered from the first target form a first combination TCO nanoparticle.

In some examples, a flow of oxygen is introduced into the deposition chamber during the deposition process such that a metallic component of the resultant TCO oxidizes during deposition. In an example where a sputtering target includes a metallic component of the resultant TCO, the oxygen which introduced into the chamber during deposition may serve as the sole oxidizer of the metallic component. In an example where a sputtering target includes a metallic oxide, a flow of oxygen during the deposition process may supplement the formation of the TCO during the deposition process, for example to achieve a desired stoichiometry.

The formation of TCO nanoparticles in a nanoparticle-reinforced plasmonic matrix during a deposition process (e.g., a sputtering codeposition from multiple targets) may be enabled by high negative Gibbs free energy (ΔG, i.e., bond strength) of stoichiometric bonding of the TCO and negligible miscibility and reactivity of the metallic component(s) of the TCO with the plasmonic metal. Such factors favor stoichiometric bonding of the metallic component of the TCO and oxygen, and thus growth of nanoparticles, over bonding of the metallic component of the nanoparticles and oxygen to the plasmonic metal. That is, a deposition process includes simultaneous deposition of a plasmonic material, wherein the atoms of the plasmonic metal bond to each other, and deposition of the TCO, wherein atoms of the metallic component of the TCO preferably oxidize and bond to other atoms of the metallic component of the TCO within the plasmonic metal. The size of the resultant TCO nanoparticles is generally on the order of 2 nm. The size of the TCO nanoparticles may be <1 nm, and the TCO nanoparticles are generally smaller than 10 nm. A nanoparticle-reinforced plasmonic matrix may include a range of TCO nanoparticle sizes (e.g., 0.5-12 nm).

In some examples, a concentration of TCO nanoparticles in a nanoparticle-reinforced plasmonic matrix is controlled by deposition rates of the respective components. For example, a sputtering process may target a concentration of TCO nanoparticles in a nanoparticle-reinforced plasmonic matrix by simultaneously depositing the plasmonic metal from a first target at a first deposition rate (e.g., a first deposition rate controlled by the power applied to the first target) and the metallic component of the resultant TCO nanoparticle from a second target at a second deposition rate (e.g., a second deposition rate controlled by the power applied to the second target). In another example, a sputtering process may target a concentration of TCO nanoparticles in a nanoparticle-reinforced plasmonic matrix by simultaneously depositing the plasmonic metal from a first target at a first deposition rate (e.g., a first deposition rate controlled by the power applied to the first target) and the TCO material from a second target at a second deposition rate (e.g., a second deposition rate controlled by the power applied to the second target).

In some examples, the concentration of TCO nanoparticles in a nanoparticle-reinforced plasmonic matrix is controlled by the composition of a source. In one example, a sputtering target may include a first composition of a plasmonic metal and a second composition of the metallic component of the resultant TCO such that a deposition process from this target results in these components being deposited at different rates and a resultant concentration of TCO nanoparticles within the nanoparticle-reinforced plasmonic matrix. In another example, a sputtering target includes a first composition of a plasmonic metal and a second composition of the TCO material such that a deposition process from this target results in these components being deposited at different rates and a resultant concentration of the TCO nanoparticles within the nanoparticle-reinforced plasmonic matrix. In these examples, the relative compositions of the respective components (i.e., the ratio of the plasmonic metal to the metallic component of the resultant TCO nanoparticle) can be targeted to achieve a desired concentration of TCO nanoparticles in the nanoparticle-reinforced plasmonic matrix.

Figure 3:
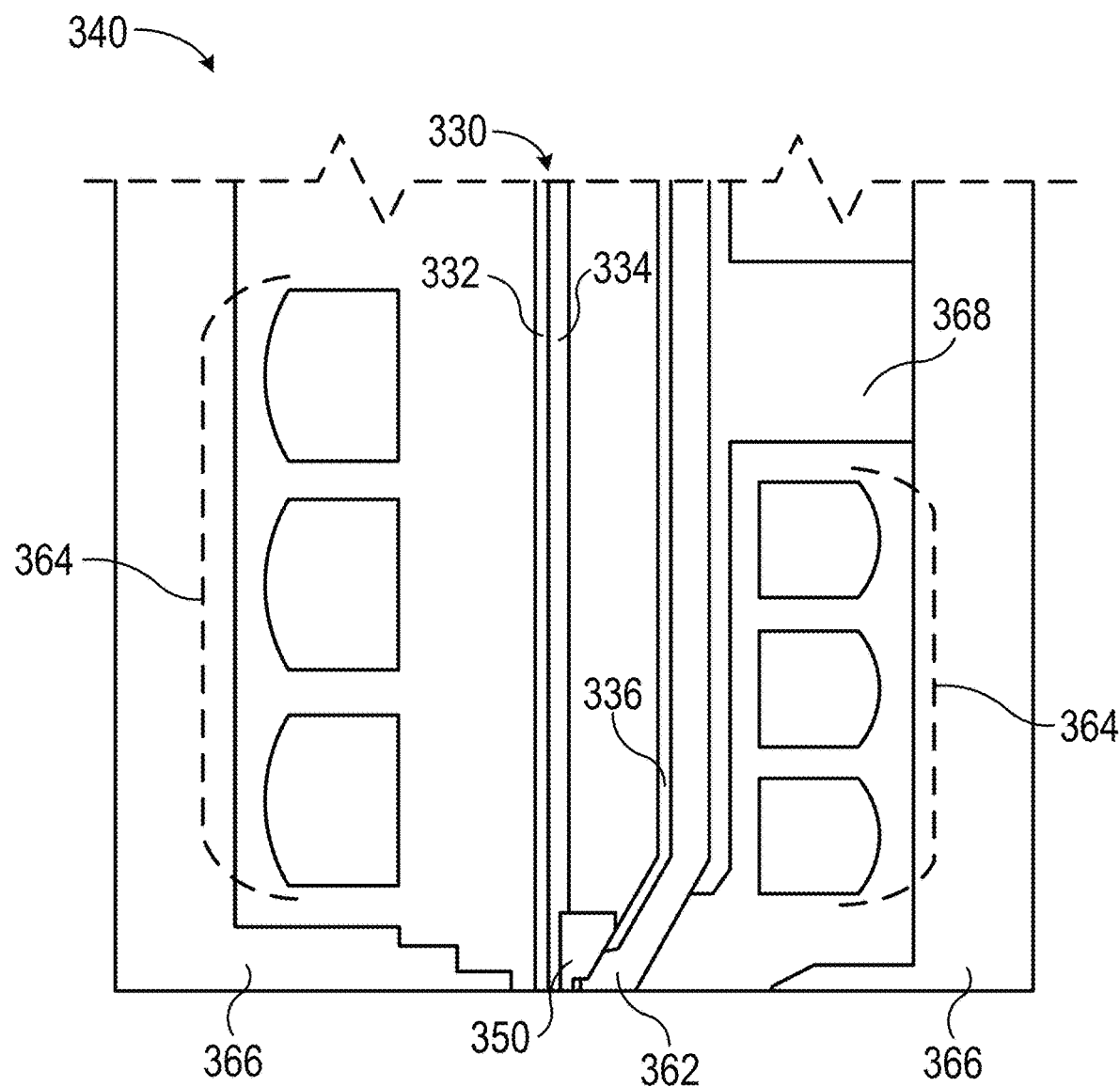
FIG. 3 is a cross-sectional view an example HAMR head, in accordance with aspects of this disclosure.

Referring now to FIG. 3, there is shown a cross-sectional view of an example HAMR head, in accordance with aspects of this disclosure. HAMR head 340 includes a waveguide 330, an NFT 350, a diffuser 336, a write pole 362, writer coils 364, return poles 366, and a yoke/via structure 368.

In an example HAMR HDD, a drive controller may output an electrical current through writer coils 364, which are configured to carry the electrical current and induce a magnetic field in write pole 362. Write pole 362 is configured to direct the magnetic field produced by writer coils 364 toward a surface of a magnetic disk to preferably orient grains of the magnetic disk into bits of data which are stored for later retrieval. An example magnetic field induced in write pole 362 may be directed toward and focused on an area external to HAMR head 340, such as an area on a surface of a magnetic disk, and returned to HAMR head 340 through return pole(s) 366. The magnetic field which returns to recording HAMR 340 through return pole(s) 366 may then be directed back to write pole 362 through a channel such as yoke/via structure 368.

NFT 350 is configured to support the generation of LSPs and focus near-field energy of the LSP distribution on a surface of a magnetic disk. NFT 350 may, in some examples, be located proximate to waveguide 330. NFT 350 of this example is physically coupled to waveguide 330 and diffuser 336. In some examples, a laser, such as laser 226 of FIG. 2, emits photons of an approximate wavelength which are directed toward NFT 350 by waveguide 330. Waveguide 330 is configured to transmit photons from a light source (e.g., laser 226 of FIG. 2) toward NFT 350 and couple the transmitted photons to a feature or features of NFT 350 in order to generate LSPs through resonance coupling of the photons with free electrons of NFT 350. In some examples, waveguide 330 is configured as a planar waveguide or channel waveguide. Waveguide 330 may include dielectric materials (e.g., aluminum oxide, silicon dioxide, niobium oxide).

Waveguide 330 may include dimensions and features which shift the momentum vector (i.e., the k vector) of the incident photons from a laser or other light source so that a component of the k vector of an incident photon of a given frequency (i.e., $\omega$) which is parallel to a waveguide 330/NFT 350 interface matches the momentum vector k of an associated LSP mode of the given frequency $\omega$. In one example, a waveguide includes gratings with periodic patterns which can shift (e.g., increase) a momentum of an incident photon. In other examples, a waveguide includes multiple layers of materials of different refractive indices, where a momentum of an incident photon in a first material of a first refractive index is shifted upon transmission into a second material of a second refractive index. Waveguide 330, for example, includes a waveguide core 332 and a core-to-NFT spacing (CNS) layer 334. Waveguide core 332 may include a first dielectric material (e.g., niobium oxide) of a first refractive index, and CNS layer 334 may include a second dielectric material (e.g., aluminum oxide, silicon dioxide) of a second refractive index. Such features and structures of waveguide 330 may, in some scenarios, manipulate a momentum component of an incident photon from a laser or other light source and match the momentum component to a momentum component of a surface plasmon mode of NFT 350 such that photons directed by waveguide 330 may couple to free electrons of NFT 350 and excite one or more LSP resonance modes.

Near-field transducer 350 may be prone to thermal defects, instability, and degradation at temperatures which are encountered by HAMR head 340 under normal operating conditions. In accordance with aspects of this disclosure, an example HAMR head (e.g., HAMR head 340) comprises one or more features comprising a nanoparticle-reinforced plasmonic matrix, wherein the one or more features comprises a near-field transducer (e.g., NFT 350). The inclusion of a nanoparticle-reinforced plasmonic matrix in NFT 350 may, in some examples, provide NFT 350 with improved thermal stability over a similar NFT which does not include a nanoparticle-reinforced plasmonic matrix. The improved thermal stability provided to NFT 350 may reduce the formation, growth, and propagation of defects, and migration of grain boundaries, when NFT 350 encounters thermal stress during repeated HAMR write processes. The improved thermal resistance of NFT 350 may, in some instances, reduce or prevent deformation, recession, and/or shrinkage of features of NFT 350, and/or delamination from other features of HAMR head 340 which are coupled to NFT 350 (e.g., waveguide 330).

Diffuser 336 of FIG. 3 is a heat sink structure which is configured to draw heat generated by the HAMR process away from NFT 350, write pole 362, and other features of HAMR head 340, and dissipate the heat toward other, less thermally sensitive areas of HAMR head 340 and its associated slider. In some examples, diffuser 336 is part of a larger heat sink structure of HAMR head 340. Diffuser 336 may include a plasmonic metal, and in some instances includes the same plasmonic metal or metals that are included in NFT 350.

Heat sink structures such as diffuser 336 may be prone to similar thermally-induced defects as NFT 350. For example, diffuser 336 may exhibit deformation, voiding, shrinkage, and/or delamination from surrounding interfaces (e.g., the diffuser 336/write pole 362 interface). In accordance with aspects of this disclosure, an example HAMR head (e.g., HAMR head 340) comprises one or more features comprising a nanoparticle-reinforced plasmonic matrix, wherein the one or more features comprises a heat sink structure (e.g., diffuser 336). The inclusion of a nanoparticle-reinforced plasmonic matrix in diffuser 336 may, in some instances, increase the thermal stability of diffuser 336 when compared to a similar diffuser which does not include a nanoparticle-reinforced plasmonic matrix.

An example HDD may include a HAMR head comprising one or more feature, wherein the one or more features comprises a first feature comprising a first nanoparticle-reinforced plasmonic matrix, and wherein the one or more features comprises a second feature comprising a second nanoparticle-reinforced plasmonic matrix. Using different nanoparticle-reinforced plasmonic matrices for different features of a HAMR head (e.g., HAMR head 340) may, in some scenarios, provide the flexibility to tune the properties of the nanoparticle-reinforced plasmonic matrices to address the defects and modes of degradation to which their respective features are most susceptible. For example, a first feature of HAMR head 340 which is active in the LSP generation process, such as NFT 350, may benefit from a nanoparticle-reinforced plasmonic matrix with optical properties and a plasmonic figure of merit which are close to those of the constituent plasmonic metal, such that the LSP formation and maintenance portions of the HAMR write process are not significantly impacted by the inclusion of the nanoparticle-reinforced plasmonic matrix. A second feature of HAMR head 340, such as a heat sink structure like diffuser 336, may not directly participate in the LSP generation process but rather may be configured to dissipate heat away from features such as NFT 350. Such a feature may not require the same optical properties that a feature like NFT 350 does, but may benefit thermally from having a higher concentration of TCO nanoparticles than the concentration of TCO nanoparticles in NFT 350, for example.

In some examples, NFT 350 of HAMR head 340 includes a first nanoparticle-reinforced plasmonic matrix, and diffuser 336 of HAMR head 340 includes a second nanoparticle-reinforced plasmonic matrix. In one example, the second nanoparticle-reinforced plasmonic matrix of diffuser 336 includes the same TCO nanoparticles that are included in the first nanoparticle-reinforced plasmonic matrix of NFT 350. In another example, the second nanoparticle-reinforced plasmonic matrix of diffuser 336 includes TCO nanoparticles which are different than TCO nanoparticles included in the first nanoparticle-reinforced plasmonic matrix.

A first feature and a second feature of HAMR head 340 may comprise a first nanoparticle-reinforced plasmonic matrix and a second nanoparticle-reinforced plasmonic matrix, respectively, wherein the first nanoparticle-reinforced plasmonic matrix includes a first concentration of TCO nanoparticles, and wherein the second nanoparticle-reinforced plasmonic matrix include a second concentration of TCO nanoparticles. That is, HAMR head 340 may comprise a first feature comprising a first nanoparticle-reinforced plasmonic matrix and a second feature comprising a second nanoparticle-reinforced plasmonic matrix, wherein the first nanoparticle-reinforced plasmonic matrix comprises a first atomic percent of a metallic component of the nanoparticles, wherein the second nanoparticle-reinforced plasmonic matrix comprises a second atomic percent of a metallic component of the nanoparticles, and wherein the atomic percent of the metallic component is measured using ICP-OES. In one example, a nanoparticle-reinforced plasmonic matrix of diffuser 336 includes TCO nanoparticles at a first concentration, and a nanoparticle-reinforced plasmonic matrix of NFT 350 includes TCO nanoparticles at a second concentration.

Figure 4A:
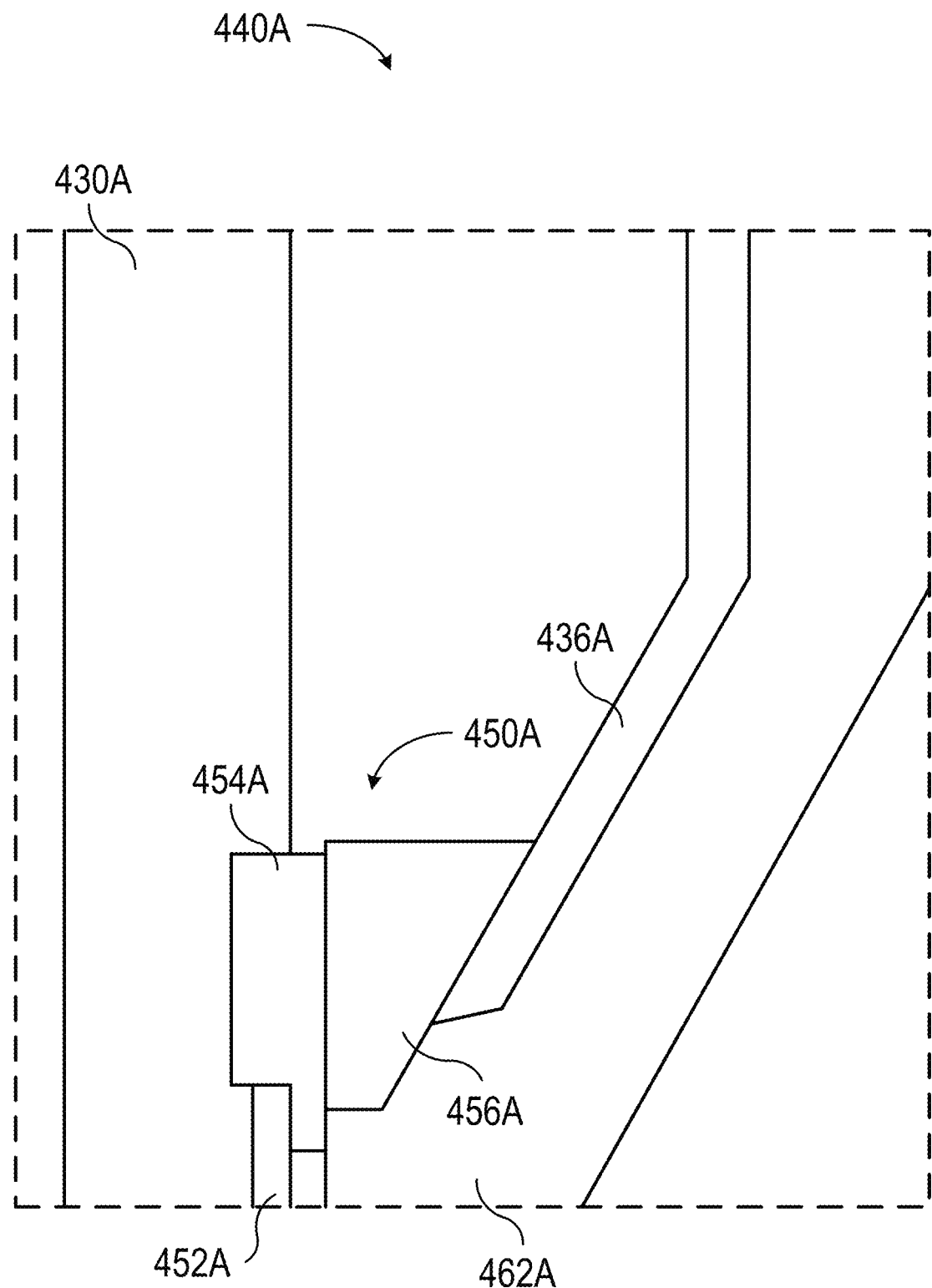
FIG. 4A-4C are cross-sectional views of example HAMR heads, in accordance with aspects of this disclosure.
Figure 4B:
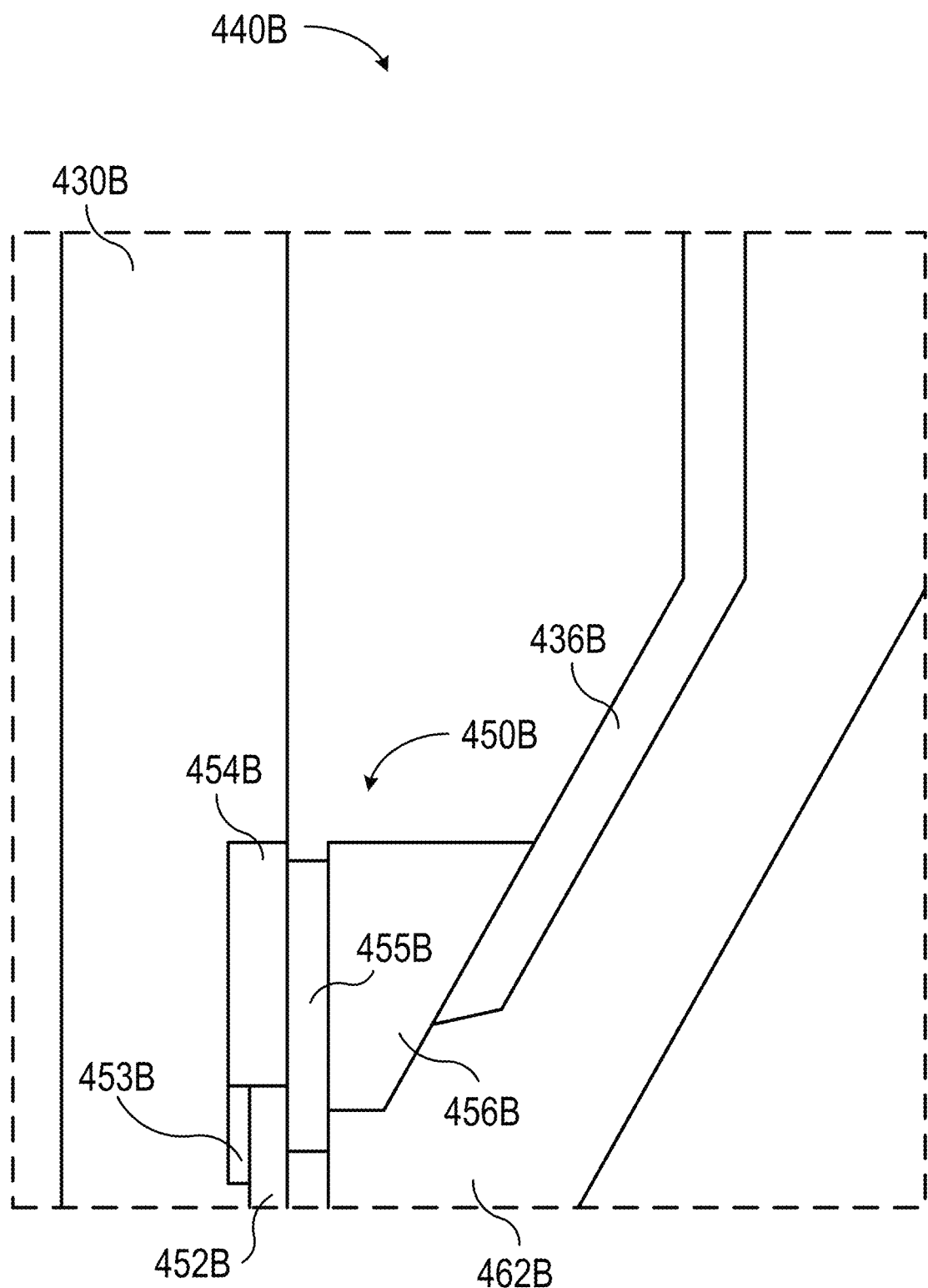
Figure 4C:
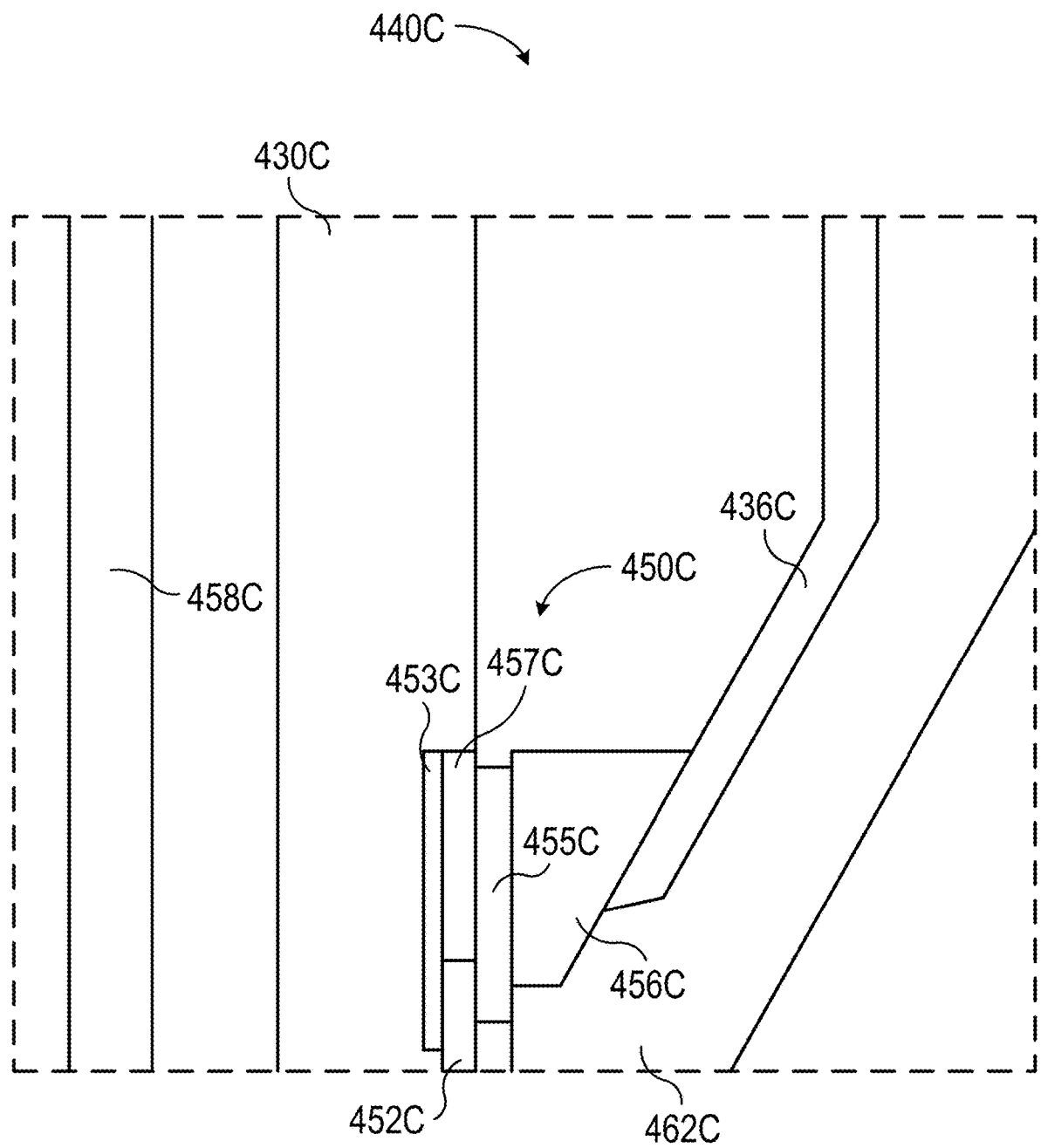

FIGS. 4A-4C are cross-sectional views of example HAMR heads, in accordance with aspects of this disclosure. NFTs of these examples include features which are geometrically structured to target the excitation of specific LSP modes (e.g., one or more specific transverse electric (TE) modes) through the coupling of free electrons in the NFT to incident photons of an approximate wavelength. NFTs of these examples include features which are structured to focus near-field energy of an LSP distribution on an area external to the HAMR head, such as on a surface of a magnetic disk.

Heat-assisted magnetic recording heads 440A, 440B and 440C of FIGS. 4A, 4B, and 4C, respectively, each include a waveguide (430A, 430B, and 430C), a diffuser (436A, 436B, and 436C), a write pole (462A, 462B, and 462C), and an NFT (450A, 450B, and 450C). NFTs 450A, 450B, and 450C of these examples include disks (DSCs) which are configured to support one or more LSP modes (e.g., a transverse electric (TE) mode) generated by coupling between free electrons of the respective DSC to an incident photon generated by a light source (e.g., laser 226 of FIG. 2) and delivered to the NFT by a waveguide (e.g., waveguides 430A, 430B, and 430C). For example, a DSC 454A of FIG. 4A may be structured to support a transverse electric octupole LSP mode (e.g., TE10) and consolidate an LSP distribution at a particular location or area of DSC 454A. NFT 450B of FIG. 4B includes a bottom disk (BDSC) 454B which is proximal to waveguide 430B. NFT 450C of FIG. 4C includes a sunken disk (SDSC) 453C which is proximal to waveguide 430C. BDSC 454B of FIG. 4B and SDSC 453C of FIG. 4C are configured generate and support an LSP distribution through coupling of free electrons to incident photons which are delivered by a waveguide (e.g., waveguide 430B of FIG. 4B, waveguide 430C of FIG. 4C) from a light source (e.g., laser 226 of FIG. 2).

Disks of an NFT which are configured for LSP generation and maintenance may include materials (i.e., plasmonic metals), dimensions, and geometries to support the generation of LSPs of a specific resonance mode or modes and transfer or condense an LSP distribution on a particular area of the DSC and/or another feature of the NFT, such as on a PEG (e.g., PEG 452A of FIG. A, PEG 452B of FIG. B, PEG 452C of FIG. C). A PEG of a respective NFT is configured to focus near-field energy of an LSP distribution and direct it toward an area external to the HAMR head, such as on a surface of a magnetic disk. Example PEGs include materials and dimensions which may promote the localization of generated LSPs and the focus of near-field energy of the LSP distribution on an area external to the recording head. In this way, the near-field energy which is focused on an area external to the recording head is a product of resonant amplification (i.e., an LSP distribution from resonant coupling of free electrons of a DSC to incident photons from a light source) and non-resonant amplification (enhancement of the near-field by localization of the LSP distribution on the PEG).

Other DSCs and other features of the example NFTs of FIGS. 4A, 4B, and 4C are configured to support NFT functions such as promoting LSP generation (e.g., through improving coupling efficiency, through reducing scattering of incident light from a light source), focusing LSP distributions, focusing near-field energy, managing and dissipating generated heat, reducing operating temperature(s) of the HAMR head features, and reducing laser power requirement. Middle disk (MDSC) 455B of FIG. 4B and MDSC 455C of FIG. 4C, for example, may assist with directing LSPs toward a respective PEG and mitigate background fields. Sunken disk (SDSC) 453B of FIG. 4B may, in some scenarios, reduce temperature and laser power. PEG anchor 457C of FIG. 4C may support the direction of LSPs toward PEG 452C. Bottom clad reflector (BCR) 458C of FIG. 4C is configured to redirect scattered light toward NFT 450C, and in some examples improves coupling efficiency the light with NFT 450C and reduces the laser power requirement. Heat sink disks (HDSCs) 456A of FIG. A, 456B of FIG. B, and 456C of FIG. C are configured to draw heat away from other DSCs and the PEG of the respective NFT, and direct the heat toward the respective diffuser (diffuser 436A of FIG. 4A, diffuser 436B of FIG. 4B, and diffuser 436B of FIG. 4C).

Disks (e.g., DSC, MDSC, SDSC, HDSC), PEGs, and other features (e.g., BCR) of the preceding example NFTs of FIGS. 4A, 4B, and 4C may be prone to thermal degradation which results from thermal exposure during operation. For example, photons received by LSP-generating DSCs such as DSC 454A, BDSC 454B, and SDSC 453C which are not converted to LSPs through coupling to free electrons of the respective DSCs may generate heat through non-radiative mechanisms such as scattering. In other examples, LSPs decay non-radiatively such as through the generation of phonons or hot electrons. Hot electrons may, in some instances, be scattered or act as scattering centers to other electrons. Additionally, a condensed distribution of LSPs on the DSCs proximal to a PEG and on the PEG itself (PEG 452A of FIG. 4A, PEG 452B of FIG. 4B, and PEG 452C of FIG. 4C), may be a source of heat. Excess heat generated in NFTs which is dissipated by an HDSC of the respective NFT (HDSC 456A of FIG. 4A, HDSC 456B of FIG. 4B, HDSC 456C of FIG. 4C) may result in defects in the respective HDSC, such as voids, deformation, and delamination from other features of the respective NFT. Repeated and prolonged thermal exposure of the DSCs, PEGs, and other features of the example recording heads of FIGS. 4A, 4B, and 4C may, in some scenarios, result in defect initiation, growth, and migration, which may reduce performance of the HAMR head and/or reduce the lifetime of HAMR head.

An example HAMR head comprises an NFT, wherein the NFT comprises a plurality of features, and wherein at least one of the plurality of features of the NFT comprises a nanoparticle-reinforced plasmonic matrix. In some scenarios, DSCs, PEGs, PEG anchors, and/or BCRs of the example NFTs of FIGS. 4A, 4B, and 4C include nanoparticle-reinforced plasmonic matrices. In some examples, a PEG includes a nanoparticle-reinforced plasmonic matrix. In some examples, one or more DSCs (e.g., a DSC, a MDSC, a SDSC, and/or a HDSC) and a PEG of an NFT include a nanoparticle-reinforced plasmonic matrix. In the example of NFT 450C of FIG. 4C, one or more DSCs (SDSC 453C, MDSC 455C, HDSC 456C), PEG 452C, PEG anchor 457C, and/or BCR 458C includes a nanoparticle-reinforced plasmonic matrix. The inclusion of a nanoparticle-reinforced plasmonic matrix in these example features may, in some scenarios, improve the thermal stability and/or extend the lifetime of the respective HAMR head. Improvements provided by the nanoparticle-reinforced plasmonic matrix may include the impedance of grain boundary migration and increased grain stability under thermal stress. In some examples, the inclusion of a nanoparticle-reinforced plasmonic matrix in a feature of an NFT may enable a higher concentration of a secondary material to be included than a similar feature which includes a non-TCO nanoparticle plasmonic metal/secondary material composite, due to the lower impact of the TCO nanoparticles on optical properties of the feature when compared to the impact of the non-TCO nanoparticle secondary materials. The higher concentration latitude which may be enabled by the use of TCO nanoparticles may provide the NFT feature with better thermal stability, physical robustness, and lifetime than a similar NFT feature which does not include a nanoparticle-reinforced plasmonic matrix.

Different features of an NFT may include the same nanoparticle-reinforced plasmonic matrix in multiple features, or may include different nanoparticle-reinforced plasmonic matrices in different features. Using different nanoparticle-reinforced plasmonic matrices for different features of an NFT (e.g., NFTs 450A, 450B, and 450C or FIGS. 4A, 4B, and 4C, respectively) may, in some scenarios, provide the flexibility to tune the properties and composition of the nanoparticle-reinforced plasmonic matrices to address the defects and modes of degradation to which their respective features are most susceptible.

In one example, a DSC of an NFT (e.g., DSC 454A of FIG. 4A, MDSC 455B of FIG. 4B, HDSC 456C of FIG. 4C) may include a first nanoparticle-reinforced plasmonic matrix and a PEG of the respective NFT may include the first nanoparticle-reinforced plasmonic matrix or a second, different nanoparticle-reinforced plasmonic matrix. In another example, a first DSC of an NFT (e.g., SDSC 453B of NFT 450B of FIG. 4B) includes a first nanoparticle-reinforced plasmonic matrix and a second DSC of the NFT (e.g. MDSC 455B or HDSC 456B of NFT 450B of FIG. 4B) includes the first nanoparticle-reinforced plasmonic matrix or a second, different nanoparticle-reinforced plasmonic matrix.

Different features of an NFT may include different nanoparticle-reinforced plasmonic matrices which have different concentrations of TCO nanoparticles. In one example, DSC 454A includes a first nanoparticle-reinforced plasmonic matrix which includes TCO nanoparticles at a first concentration, and PEG 452A includes a second nanoparticle-reinforced plasmonic matrix which includes TCO nanoparticles at the same first concentration or at a second, different concentration.

In some examples, different features of an NFT include nanoparticle-reinforced plasmonic matrices with different TCO nanoparticles. For example, an HDSC may include a first nanoparticle-reinforced plasmonic matrix which includes a first type of TCO nanoparticles, and a BDSC or a SDSC includes a second nanoparticle-reinforced plasmonic matrix which includes a second type of TCO nanoparticles. In another example, a PEG may benefit from a different TCO nanoparticle and/or a different concentration than a respective PEG anchor or DSC.

Figure 5:
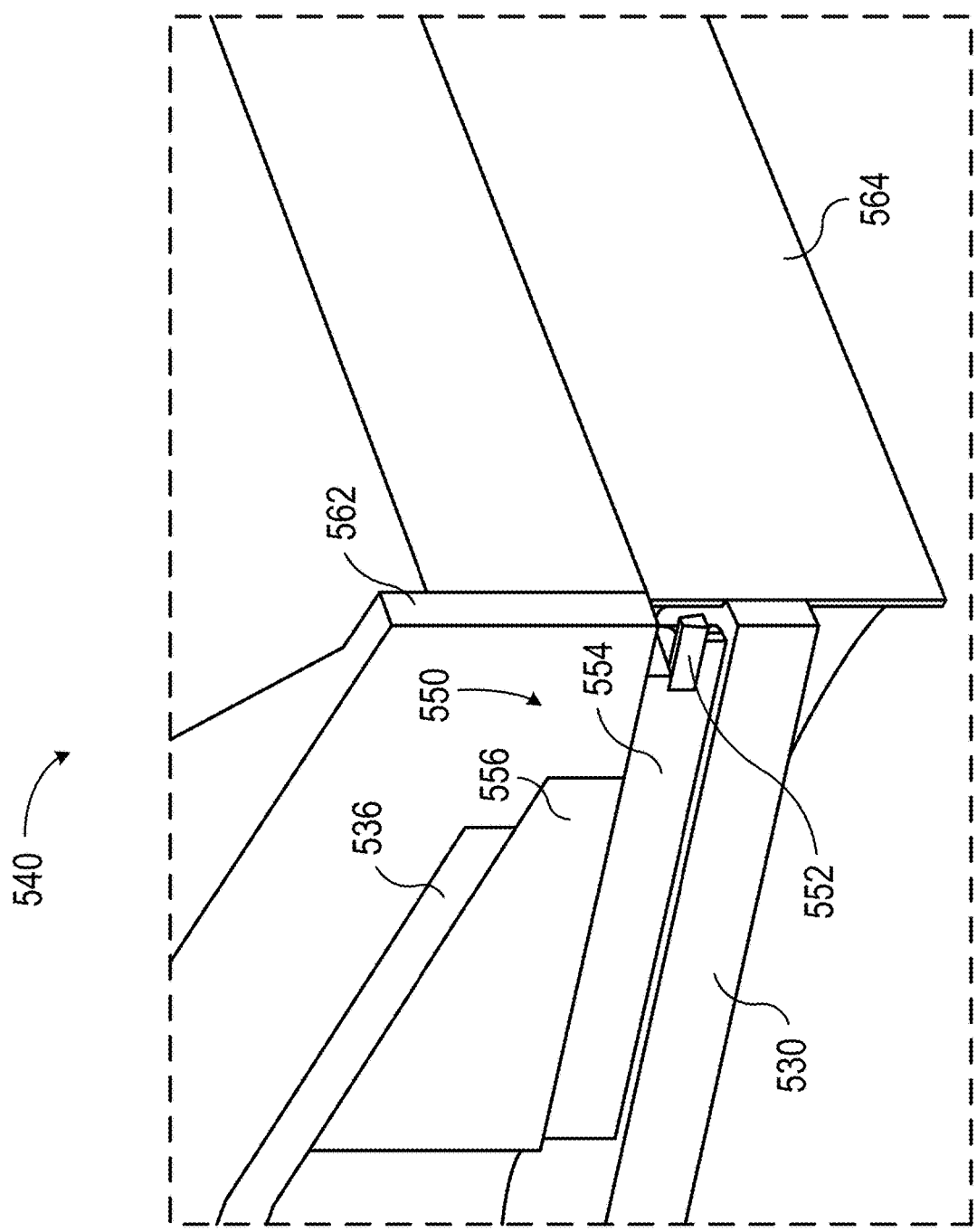
FIG. 5 is a perspective view of an example HAMR head, in accordance with aspects of this disclosure.

FIG. 5 is a perspective view of an example HAMR head, in accordance with aspects of this disclosure. HAMR head 540 includes a waveguide 530, a diffuser 536, a write pole 562, an NFT 550, and a miniature solid immersion mirror (mSIM) 564. NFT 550 includes a DSC 554, a HDSC 556, and a PEG 552.

mSIM 564 is configured to improve LSP coupling efficiency and reduce required laser power by blocking scattered incident photons from a source (e.g., laser 226 of FIG. 2), blocking photons from reaching external surfaces such as a surface of a magnetic disk, and reducing reflection from surfaces such as an air-bearing surface (ABS). In some examples, mSIM 564 includes a nanoparticle-reinforced plasmonic matrix. The use of a nanoparticle-reinforced plasmonic matrix in mSIM 564 may improve thermal stability of mSIM 564 over similar mSIMs which do not include a nanoparticle-reinforced plasmonic matrix by reducing, mitigating, and/or preventing one or more thermally-induced defect modes such as grain boundary migration, deformation, feature recession, voiding, and/or delamination from other surrounding features (e.g., delamination at the mSIM 564/waveguide 530 interface). In some examples, the use of a nanoparticle-reinforced plasmonic matrix in mSIM 564 may enable a higher concentration of a secondary material to be included than a similar mSIM which includes a non-TCO nanoparticle plasmonic metal/secondary material composite, due to the lower impact of the TCO nanoparticles on optical properties of the mSIM when compared to the impact of non-TCO nanoparticle secondary materials. The higher concentration latitude which may be enabled by the use of TCO nanoparticles may provide mSIM 564 with better thermal stability, physical robustness, and lifetime than a similar mSIM which does not include a nanoparticle-reinforced plasmonic matrix.

Figure 6:
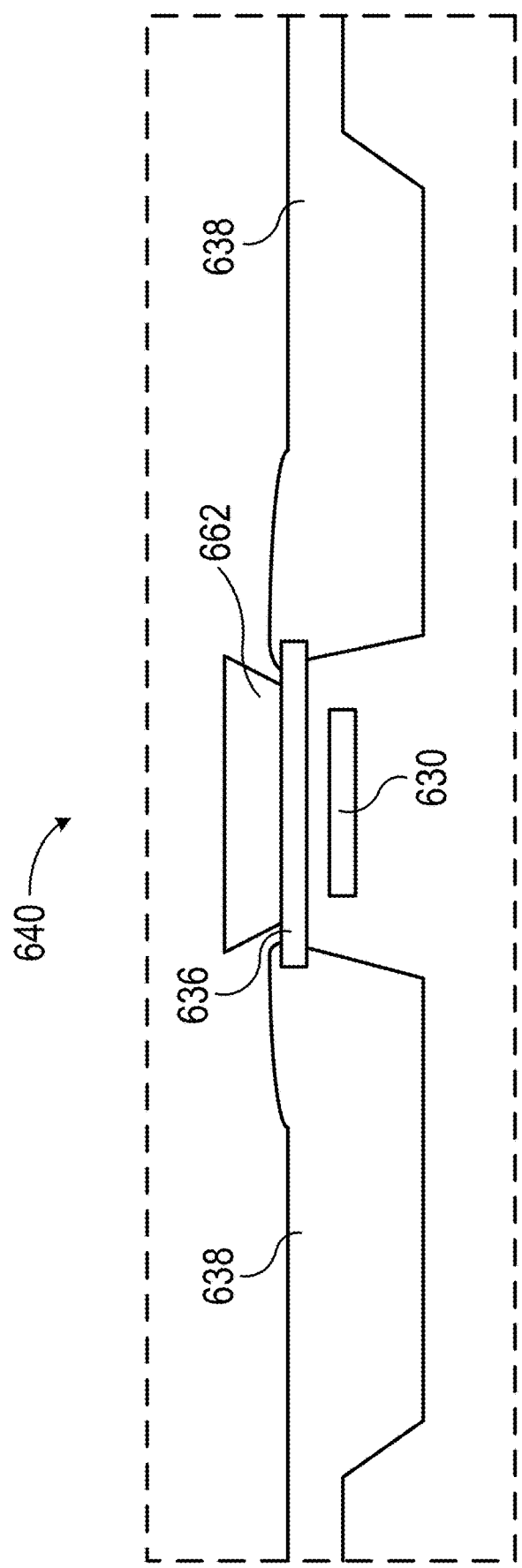
FIG. 6 is a cross-sectional view behind the air-bearing surface (ABS) of an example HAMR head, in accordance with aspects of this disclosure.

FIG. 6 is a cross-sectional view behind the air-bearing surface (ABS) of an example HAMR head, in accordance with aspects of this disclosure. HAMR head 640 includes a waveguide 630, a write pole 662, a diffuser 636, and a heat sink 638. Diffuser 636 is coupled to write pole 662, heat sink 638 and an NFT (not shown). Diffuser 636 may be an example of diffuser 336 of FIG. 3, which is coupled to NFT 350 of FIG. 3. Diffuser 636 is configured to dissipate heat away from the NFT to which it is adjacent and direct the heat toward heat sink 638. Heat sink 638 is configured to draw heat further away from the NFT of HAMR head 640 and dissipate it away from thermally sensitive areas of HAMR head 640. In some instances, heat sink 638 occupies more volume and is able to absorb and dissipate more heat than diffuser 636.

Diffuser 636 and heat sink 638 may be part of a larger heat sink structure of HAMR head 640. A heat sink structure may, in some examples, include a nanoparticle-reinforced plasmonic matrix. In some examples, diffuser 636 includes a nanoparticle-reinforced plasmonic matrix. In some examples, heat sink 638 includes a nanoparticle-reinforced plasmonic matrix. In some examples, diffuser 636 and heat sink 638 include nanoparticle-reinforced plasmonic matrices. Diffuser 636 and heat sink 638 may include the same nanoparticle-reinforced plasmonic matrix or different nanoparticle-reinforced plasmonic matrices. In one example, diffuser 636 and heat sink 638 include nanoparticle-reinforced plasmonic matrices which include the same TCO nanoparticles. In one example, diffuser 636 and heat sink 638 include nanoparticle-reinforced plasmonic matrix which include different TCO nanoparticles. Diffuser 636 and heat sink 638 may include different nanoparticle-reinforced plasmonic matrices which include TCO nanoparticles at different concentrations. For example, diffuser 636 may include a first nanoparticle-reinforced plasmonic matrix which includes TCO nanoparticles at a first concentration, and heat sink 638 may include a second nanoparticle-reinforced plasmonic matrix which includes TCO nanoparticles at a second, different concentration. The inclusion of a nanoparticle-reinforced plasmonic matrix in diffuser 636 and/or heat sink 638 may provide higher thermal robustness than similar diffusers and heat sinks which do not include a nanoparticle-reinforced plasmonic matrix. The higher thermal robustness may result from a grain boundary pinning effect provided by the TCO nanoparticles of the nanoparticle-reinforced plasmonic matrix, which, in some scenarios, improves grain stability and reduces the initiation and propagation of thermal defects.

In accordance with aspects of this disclosure, example HAMR heads comprise at least one of: (i) a peg; (ii) a disk; (iii) a miniature solid immersion mirror; and (iv) a heat sink structure, wherein the at least one of the peg, disk, miniature solid immersion mirror, or heat sink structure comprises a nanoparticle-reinforced plasmonic matrix, wherein the nanoparticle-reinforced plasmonic matrix comprises: (i) a plasmonic material; and (ii) a plurality of nanoparticles dispersed in the plasmonic material, and wherein the nanoparticles comprise a TCO. In some examples, the TCO of the nanoparticles of the nanoparticle-reinforced plasmonic matrix of the at least one of the peg, disk, miniature solid immersion mirror, or heat sink structure comprises zinc oxide; indium oxide; tin oxide; cadmium oxide; nickel oxide; indium tin oxide; indium zinc oxide; or combinations thereof. In one example, the TCO of the nanoparticles of the nanoparticle-reinforced plasmonic matrix of the at least one of the peg, disk, miniature solid immersion mirror, or heat sink structure comprises zinc oxide. In some examples, the nanoparticle-reinforced plasmonic matrix of the at least one of the peg, disk, miniature solid immersion mirror, or heat sink structure comprises up to about 15 atomic percent of a metallic component of the nanoparticles, wherein the atomic percent of the metallic component is measured using ICP-OES. In some examples, a HAMR head comprises at least one of: (i) a peg; (ii) a disk; (iii) a miniature solid immersion mirror; and (iv) a heat sink structure, wherein the at least one of the peg, disk, miniature solid immersion mirror, or heat sink structure is a first feature comprising a first nanoparticle-reinforced plasmonic matrix, and wherein a second feature of the at least one of the peg, disk, miniature solid immersion mirror, or heat sink structure comprises a second nanoparticle-reinforced plasmonic matrix.

EXAMPLE

Example plasmonic metal/secondary metal composites were cosputtered from sputtering targets, with a first target comprising gold (i.e., the plasmonic metal) and a second target comprising a nanoparticle material. A non-TCO nanoparticle plasmonic metal/secondary metal composite (hereafter the reference composite) comprised gold and dispersed yttrium oxide ($Y_2O_3$) nanoparticles. The example nanoparticle-reinforced plasmonic matrix comprised gold as the plasmonic metal, with dispersed TCO nanoparticles comprising zinc oxide (ZnO). The composition of the nanoparticles in the plasmonic metal/secondary metal composites was controlled by the relative deposition rates of the gold and nanoparticle material. Deposition rates of an example sputtered plasmonic metal/secondary metal composite may be controlled by the power applied to each sputtering target. For example, a first power may be applied to the gold target, resulting in a first deposition rate of gold, and a second power (e.g., a second power which is different than the first power, a second power which is the same as the first power) may be applied to the target comprising the nanoparticle material, resulting in a second deposition rate of the nanoparticle material. The size of the resultant nanoparticles is generally on the order of 2 nm. The size of the nanoparticles may be <1 nm, and the nanoparticles are generally smaller than 10 nm. A dispersion of nanoparticles in gold may include a range of nanoparticle sizes (e.g., 0.5-12 nm).

FIG. 7 is a table of optical and plasmonic properties of the example co-sputtered plasmonic metal/secondary metal composites and pure gold (i.e., no nanoparticles). Nanoparticle compositions of the composites are reported as atomic percent (at. %) of the metallic component of the nanoparticle in the plasmonic metal/secondary metal composite, and range from 0.47% to 2.04% for $Y_2O_3$ (non-TCO) and 0.83% to 3.22% for ZnO (TCO).

Pure gold (Au) has a refractive index (n) of 0.131 and extinction coefficient (k) of 5.55. Refractive index n increases to 0.136 with the introduction of non-TCO nanoparticles at a composition of 0.47% and further increases with higher concentrations of non-TCO nanoparticles. For example, at a non-TCO nanoparticle concentration of 2.04%, n is 0.250, nearly double that of pure Au. Extinction coefficient k is also impacted by the introduction of non-TCO nanoparticles, increasing to 5.84 with a non-TCO nanoparticle concentration of 0.47% and decreasing to 5.69 at a non-TCO nanoparticle concentration of 2.04%.

Refractive index n decreases slightly from 0.131 for pure gold to 0.129 with the introduction of TCO nanoparticles at a concentration of 0.83%. Refractive index n is relatively stable with increasing concentration of TCO nanoparticles, decreasing slightly to 0.127 at a concentration of 3.22%. Extinction coefficient k decreases slightly with the introduction of TCO nanoparticles at a concentration of 0.83%, further decreasing to 5.46 at a non-TCO nanoparticle concentration of 3.22%.

Plasmonic figure of merit changes negligibly from that of pure Au with the inclusion of non-TCO nanoparticles at a concentration of 0.47% but decreases significantly at higher concentrations of non-TCO nanoparticles (e.g., 20.22 at 0.82%, 11.34 at 2.04%). In contrast, the introduction of TCO nanoparticles leaves the plasmonic figure of merit relatively unchanged at all of the TCO nanoparticle concentrations which were studied. That is, plasmonic figure of merit of a gold dispersion with 2% TCO nanoparticles is similar to the plasmonic efficiency of pure gold, while the plasmonic figure of merit of a gold dispersion with 2% non-TCO nanoparticles is reduced by about 47% relative to the plasmonic figure of merit of pure gold. The decrease in plasmonic figure of merit with increasing concentration of non-TCO nanoparticles appears to result mainly from increased scattering loss, as scattering loss increases by about 80% from a non-TCO nanoparticle concentration of 0.47% to a non-TCO nanoparticle concentration of 2.04% while carrier density decreases by only about 5% over the same concentration range. This result suggests that, in contrast to non-TCO nanoparticles, the introduction of TCO nanoparticles has negligible impact on plasmonic figure of merit and may, at some concentrations, offer a benefit of improving the thermal robustness and stability of an associated HAMR head feature without sacrificing plasmonic efficiency.

Figure 8:
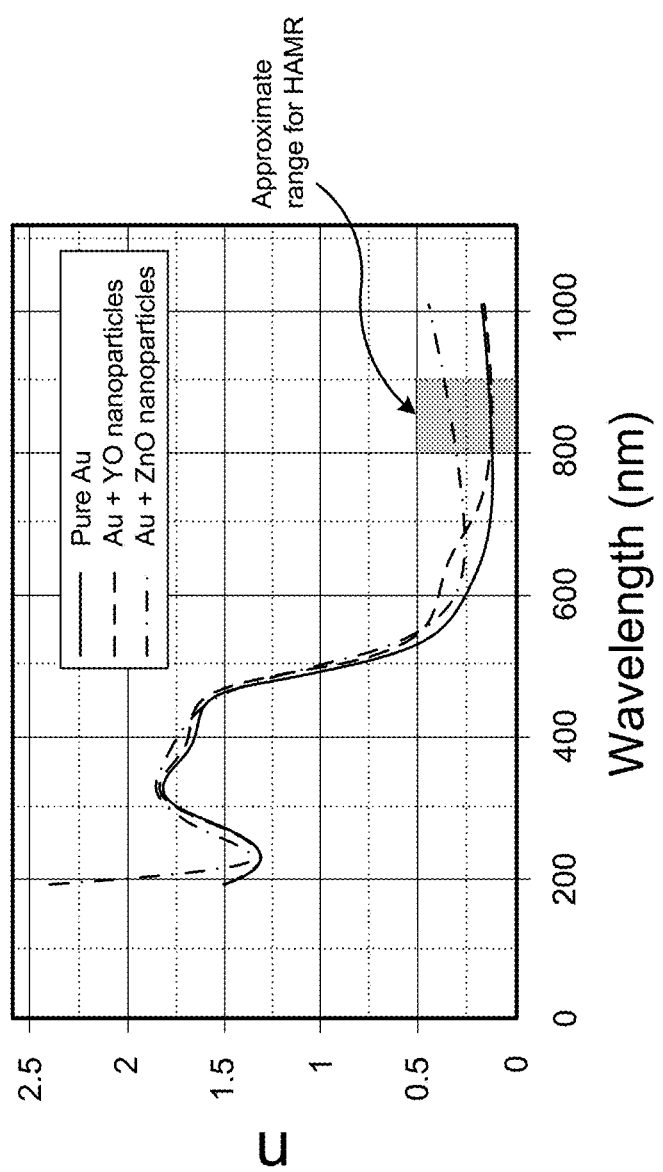
FIG. 8 is a plot of refractive index versus optical wavelength for pure gold and gold/nanoparticle dispersions, a reference plasmonic metal/secondary metal composite, and a nanoparticle-reinforced plasmonic matrix.

FIG. 8 is a plot of refractive index versus optical wavelength for pure gold and two gold/nanoparticle composites, a reference plasmonic metal/secondary metal composite (Au+yttrium oxide (YO) nanoparticles), and a nanoparticle-reinforced plasmonic matrix (Au+ZnO nanoparticles). The plot shows similar refractive index n for pure gold and both gold/nanoparticle composites in the wavelength range from about 200 nm to about 500 nm. Between 500 nm and 800 nm, both gold/nanoparticle composites have higher n than pure gold. However, in the range of 800 nm to 1000 nm, and in particular in the 800 nm to 900 nm range which is optimal for plasmonic generation in gold, the nanoparticle-reinforced plasmonic matrix has similar n to pure gold while the reference composite has higher n than pure gold. That is, in the wavelength range which is typically targeted for HAMR light sources due to favorable resonant LSP generation in plasmonic metals, the inclusion of TCO nanoparticles in gold (i.e., in the nanoparticle-reinforced plasmonic matrix) has negligible impact to n while the inclusion of non-TCO nanoparticles in gold increases n.

Figure 9:
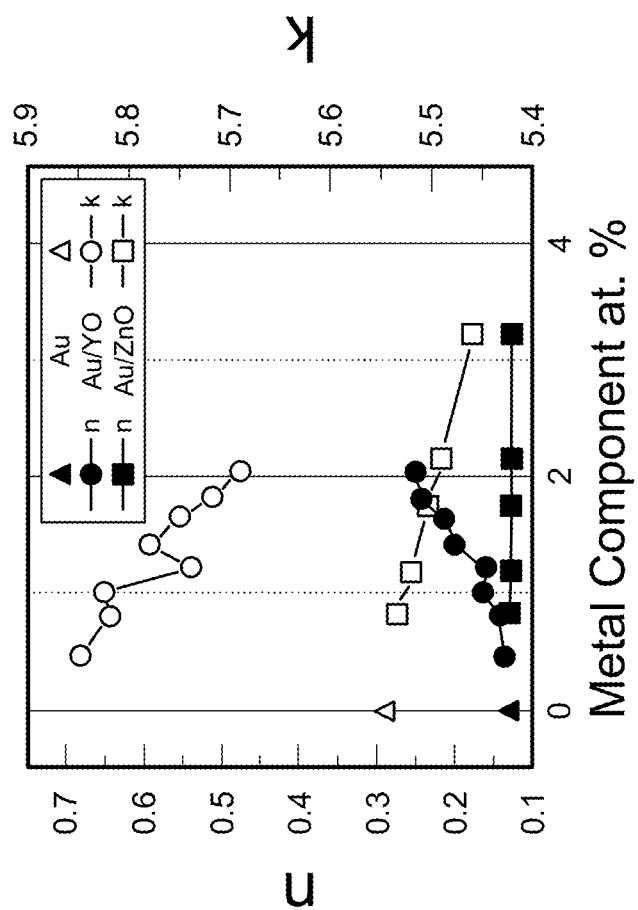
FIG. 9 is a plot of refractive index n and extinction coefficient k versus atomic percent (at. %) of the metal component of the nanoparticle of example plasmonic metal/secondary metal composites.

FIG. 9 is a plot of refractive index n and extinction coefficient k versus atomic percent (at. %) of the metal component of the nanoparticle of the example plasmonic metal/secondary metal composites. The reference composite (Au/YO) and example nanoparticle-reinforced plasmonic matrix (Au/ZnO) are shown, with refractive index n shown on the left y-axis and extinction coefficient k shown on the right y-axis. Pure gold (0%) is included for reference. Refractive index n increases with increasing concentration of non-TCO nanoparticles in the reference composite and remains constant with increasing concentration of TCO nanoparticles in the nanoparticle-reinforced plasmonic matrix. Extinction coefficient k increases from that of pure gold with increasing concentration of non-TCO nanoparticles in the reference composite and remains similar to that of pure gold with increasing concentration of TCO nanoparticles in the nanoparticle-reinforced plasmonic matrix.

Figure 10:
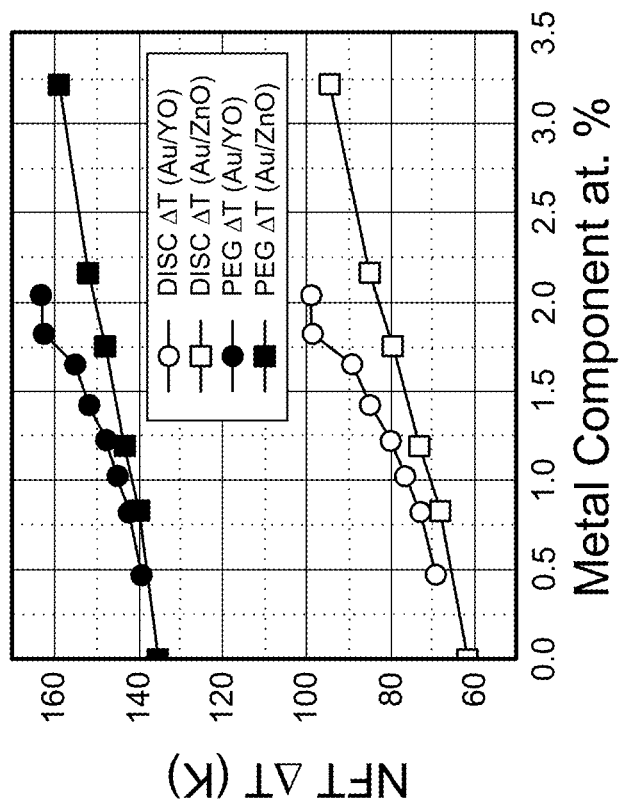
FIG. 10 is a plot of temperature change (ΔT) of NFT features during HAMR operation versus atomic percent (at. %) of the metal component of the nanoparticle of example plasmonic metal/secondary metal composites.

FIG. 10 is a plot of temperature change ($\Delta T$) of NFT features during HAMR operation versus atomic percent (at. %) of the metal component of the nanoparticle of example plasmonic metal/secondary metal composites. The reference composite (Au/YO) and example nanoparticle-reinforced plasmonic matrix (Au/ZnO) are shown, and $\Delta T$ properties of both DSCs and PEGs are included. $\Delta T$ is a metric of temperature change of a feature under operation, and a lower $\Delta T$ is preferable for stability of an associated HAMR head. $\Delta T$ increases with increasing nanoparticle concentration for both the reference composite and the nanoparticle-reinforced plasmonic matrix, which may be due to a decrease in thermal conductivity with increasing nanoparticle concentration. $\Delta T$ of a DSC and a PEG is higher for the reference composite than for the nanoparticle-reinforced plasmonic matrix across all nanoparticle composition ranges. Additionally, $\Delta T$ begins to increase more rapidly for the reference composite at nanoparticle concentrations above about 1%. A high $\Delta T$ with the inclusion of nanoparticles may, in some examples, offset some of the thermal stability gains achieved with the nanoparticles due to increasing the peak operating temperature of the NFT feature. In this example, the use of a nanoparticle-reinforced plasmonic matrix has a lower impact to $\Delta T$ relative to that of pure gold than non-TCO nanoparticle reference composite, particularly at nanoparticle concentrations above 1%. This suggests that the use of a nanoparticle-reinforced plasmonic matrix in a feature of a HAMR head may provide improved thermal stability with lower impact to operating temperature than a similar feature which includes a non-TCO nanoparticle plasmonic metal/secondary material composite.

What is claimed is:

1. A device comprising a heat-assisted magnetic recording head, the heat-assisted magnetic recording head comprising one or more features comprising a nanoparticle-reinforced plasmonic matrix,
   wherein the nanoparticle-reinforced plasmonic matrix comprises:
   (i) a plasmonic metal; and
   (ii) a plurality of nanoparticles dispersed in the plasmonic metal,
   wherein the nanoparticles comprise a transparent conductive oxide, and
   wherein a refractive index of the nanoparticle-reinforced plasmonic matrix at a wavelength is within plus or minus 4 percent of a refractive index of the plasmonic metal at the wavelength.

2. The device of claim 1, wherein the transparent conductive oxide comprises zinc oxide; indium oxide; tin oxide; cadmium oxide; nickel oxide; indium tin oxide; indium zinc oxide; or combinations thereof.

3. The device of claim 2, wherein the transparent conductive oxide further comprises a dopant, and wherein the dopant comprises aluminum; tin; fluorine; antimony; indium; molybdenum; tantalum; zirconium; boron; gallium; magnesium; lithium; or combinations thereof.

4. The device of claim 1, wherein the transparent conductive oxide comprises zinc oxide.

5. The device of claim 1, wherein the one or more features comprises a near-field transducer.

6. The device of claim 5, wherein the near-field transducer comprises a plurality of features, and wherein at least one of the plurality of features of the near-field transducer comprises the nanoparticle-reinforced plasmonic matrix.

7. The device of claim 1, wherein the one or more features comprises a heat sink structure.

8. The device of claim 1, wherein the plasmonic metal comprises gold; silver; ruthenium; copper; aluminum; rhodium; or combinations thereof.

9. The device of claim 1, wherein the plasmonic metal comprises gold.

10. The device of claim 1, wherein the nanoparticle-reinforced plasmonic matrix comprises up to about 15 atomic percent of a metallic component of the transparent conductive oxide of the nanoparticles, and wherein the atomic percent of the metallic component is measured using inductively coupled plasma optical emission spectroscopy.

11. The device of claim 1, wherein the nanoparticle-reinforced plasmonic matrix further comprises at least one secondary atom.

12. The device of claim 11, wherein a concentration of the at least one secondary atom in the nanoparticle-reinforced plasmonic matrix is up to about 20 atomic percent.

13. The device of claim 11, wherein the at least one secondary atom comprises nickel (Ni); boron (B); bismuth (Bi); indium (In); sulfur (S); silicon (Si); tin (Sn); manganese (Mn); tellurium (Te); holmium (Ho); lutetium (Lu); praseodymium (Pr); scandium (Sc); uranium (U); barium (Ba); chlorine (Cl); cesium (Cs); dysprosium (Dy); europium (Eu); fluorine (F); germanium (Ge); hydrogen (H); iodine (I); rubidium (Rb); selenium (Se); terbium (Tb); nitrogen (N); oxygen (O); carbon (C); antimony (Sb); gadolinium (Gd); samarium (Sm); thallium (Tl); cadmium (Cd); neodymium (Nd); phosphorus (P); lead (Pb); hafnium (Hf);

niobium (Nb); erbium (Er); zinc (Zn); magnesium (Mg); palladium (Pd); vanadium (V); zinc (Zn); chromium (Cr); iron (Fe); lithium (Li); platinum (Pt); sodium (Na); strontium (Sr); calcium (Ca); yttrium (Y); thorium (Th); beryllium (Be); thulium (Tm); erbium (Er); ytterbium (Yb); promethium (Pm); neodymium (Nd); cobalt (Co); cerium (Ce); lanthanum (La); praseodymium (Pr); or combinations thereof.

14. The device of claim 1,
wherein the one or more features comprises a first feature comprising a first nanoparticle-reinforced plasmonic matrix, and
wherein the one or more features comprises a second feature comprising a second nanoparticle-reinforced plasmonic matrix.

15. The device of claim 14,
wherein the first nanoparticle-reinforced plasmonic matrix comprises a first atomic percent of a metallic component of the nanoparticles,
wherein the second nanoparticle-reinforced plasmonic matrix comprises a second atomic percent of a metallic component of the nanoparticles, and
wherein an atomic percent of a metallic component is measured using inductively coupled plasma optical emission spectroscopy.

* * * * *